(12) United States Patent
Choi et al.

(10) Patent No.: US 11,740,718 B2
(45) Date of Patent: Aug. 29, 2023

(54) ELECTRONIC DEVICE HAVING A SENSOR LAYER

(71) Applicant: Samsung Display Co., Ltd., Yongin-Si (KR)

(72) Inventors: Wonjun Choi, Seoul (KR); Il-Joo Kim, Hwaseong-si (KR); Yeri Jeong, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/410,018

(22) Filed: Aug. 24, 2021

(65) Prior Publication Data

US 2022/0197420 A1 Jun. 23, 2022

(30) Foreign Application Priority Data

Dec. 21, 2020 (KR) .......................... 10-2020-0179637

(51) Int. Cl.
| | |
|---|---|
| *G06F 3/041* | (2006.01) |
| *G06F 3/044* | (2006.01) |
| *G06F 1/16* | (2006.01) |
| *H01L 27/32* | (2006.01) |
| *H01L 51/52* | (2006.01) |

(Continued)

(52) U.S. Cl.
CPC ............ *G06F 3/0412* (2013.01); *G06F 1/163* (2013.01); *G06F 3/0446* (2019.05); *H10K 50/84* (2023.02); *H10K 59/122* (2023.02); *H10K 59/131* (2023.02); *H10K 59/40* (2023.02);

(Continued)

(58) Field of Classification Search
CPC ............... H01L 27/323; H01L 27/3276; H01L 27/3216; H01L 27/3246; H01L 51/5237; H01L 27/3218; G06F 1/163; G06F 3/0446; G06F 3/0412; G06F 1/1643;
(Continued)

(56) References Cited

U.S. PATENT DOCUMENTS 9,772,709 B2   9/2017  Kim et al.
10,579,174 B2  3/2020  Kim et al.
(Continued)

FOREIGN PATENT DOCUMENTS

| KR | 10-1050464 | 7/2011 |
| KR | 10-2017-0119794 | 10/2017 |
| KR | 10-2018-0056449 | 5/2018 |

*Primary Examiner* — Deeprose Subedi
(74) *Attorney, Agent, or Firm* — F. Chau & Associates, LLC

(57) ABSTRACT

An electronic device includes a display layer comprising emission areas that provide different colored light, respectively, and a non-emission area adjacent thereto. A sensor layer comprises a first sensing insulating layer, a first conductive layer, a second sensing insulating layer, and a second conductive layer and comprising mesh lines extending in first and second directions. The mesh lines comprise a first line extending in the first direction, second and third lines extending in the second direction from opposite sides of the first line, and a fourth line spaced apart from the third line in the first direction and extending in the second direction from the first line. A reinforcing pattern is disposed on inner areas defined by the first line and each of the second to fourth lines, respectively. The reinforcing pattern protrudes from portions of the first to fourth lines that define each inner area of the inner areas.

20 Claims, 20 Drawing Sheets

(51) Int. Cl.
   *H10K 50/84*   (2023.01)
   *H10K 59/40*   (2023.01)
   *H10K 59/122*  (2023.01)
   *H10K 59/131*  (2023.01)

(52) U.S. Cl.
   CPC ............... *G06F 2203/04111* (2013.01); *G06F 2203/04112* (2013.01)

(58) Field of Classification Search
   CPC . G06F 2203/04112; G06F 2203/04111; G04G 21/00
   See application file for complete search history.

(56) References Cited

U.S. PATENT DOCUMENTS

| | | | |
|---|---|---|---|
| 10,685,626 B2 | 6/2020 | Kim et al. | |
| 2016/0077629 A1* | 3/2016 | Ono | G06F 3/0445 345/174 |
| 2016/0378224 A1* | 12/2016 | Kwon | G06F 3/0445 345/174 |
| 2022/0155902 A1* | 5/2022 | Chuang | G06F 3/0446 |

\* cited by examiner

ELECTRONIC DEVICE HAVING A SENSOR LAYER

CROSS-REFERENCE TO RELATED APPLICATIONS

This application claims priority under 35 U.S.C. § 119 to Korean Patent Application No. 10-2020-0179637, filed on Dec. 21, 2020 in the Korean Intellectual Property Office, the disclosure of which is incorporated by reference in its entirety herein.

1. TECHNICAL FIELD

The present inventive concepts herein relate to an electronic device including a sensor layer having increased rigidity and sensing sensitivity.

2. DISCUSSION OF RELATED ART

An electronic device may include a display layer that displays an image and a sensor layer that senses an external input. The sensor layer may include a plurality of electrodes. Electronic devices having active areas of various shapes have recently been developed. For example, a sensor layer configured to sense an external input may be provided in a wearable electronic device, such as a smartwatch, etc.

SUMMARY

The present inventive concepts provide an electronic device including a sensor layer having increased rigidity and sensing sensitivity.

According to an embodiment of the present inventive concepts, an electronic device includes a display layer comprising a plurality of emission areas that provide different colored light, respectively, and a non-emission area that is adjacent to the plurality of emission areas. A sensor layer comprises a first sensing insulating layer disposed on the display layer, a first conductive layer disposed on the first sensing insulating layer, a second sensing insulating layer disposed on the first sensing insulating layer to cover the first conductive layer, and a second conductive layer disposed on the second sensing insulating layer and comprising mesh lines extending in first and second directions that cross each other. The mesh lines include a first line extending in the first direction, a second line extending in the second direction from a first side of the first line, a third line extending in the second direction from a second side of the first line that is opposite to the first side of the first line and a fourth line spaced apart from the third line in the first direction and extending in the second direction from the second side of the first line. A reinforcing pattern is disposed on inner areas defined by the first line and each of the second line, the third line, and the fourth line, respectively. The reinforcing pattern protrudes from portions of the first to fourth lines that define each inner area of the inner areas.

In an embodiment, an angle defined by the lines, which define each of the inner areas, and the reinforcing pattern may be about 15 degrees or more to about 35 degrees or less.

In an embodiment, the reinforcing pattern may be symmetric with respect to a virtual extension line which passes through a center of the reinforcing pattern and extends in a diagonal direction with respect to each of the first direction and the second direction.

In an embodiment, in the reinforcing pattern, a portion of the reinforcing pattern, which faces the inner area, may have a predetermined curvature.

In an embodiment, the reinforcing pattern may have a width that is gradually narrowed from an intersection of the lines defining the inner area in the first direction and the second direction.

In an embodiment, the emission areas may include: a first emission area disposed at a left side with respect to the first line to provide a first color, a second emission area disposed at a right side with respect to the first line and an upper side with respect to the fourth line to provide a second color; and a third emission area disposed at a right side with respect to the first line and a lower side with respect to the fourth line to provide a third color, wherein the first emission area may include a first first emission area and a second first emission area, which are spaced apart from each other with the non-emission area therebetween in the first direction and have areas different from each other.

In an embodiment, a distance from one side of each of the first to third emission areas to each of the adjacent mesh lines on a plane may be less than or equal to a distance from a corner of each of the first to third emission areas to the adjacent reinforcing pattern.

In an embodiment, an emission groove, of which a portion is recessed in the plane, may be defined in at least one of the second emission area or the third emission area.

In an embodiment, the sensor layer may include: first sensing electrodes which is provided in plurality and arranged in the first direction and each of which includes first sensing patterns arranged in the second direction and a first bridge pattern disposed between the first sensing patterns; and second sensing electrodes which are insulated from the first sensing electrodes and provided in plurality to be arranged in the second direction and each of which includes second sensing patterns arranged in the first direction and a second bridge pattern disposed between the second sensing patterns, wherein the second conductive layer may include the first sensing patterns, the first bridge pattern, and the second sensing patterns, the first conductive layer may include the second bridge pattern, contact holes overlapping the second bridge pattern are defined in the second sensing insulating layer, and the second sensing patterns are connected to the second bridge pattern through the contact holes.

In an embodiment, the second bridge pattern may include an additional reinforcing pattern each of which at least a portion overlaps the reinforcing pattern.

In an embodiment, a virtual first center line extending in the first direction and passing through a center of the first line may be defined, and a center of each of the contact holes may overlap the third line and the fourth line, which are spaced apart from the first center line in the second direction to correspond to each other.

In an embodiment, the additional reinforcing pattern may include: a first additional pattern that is angled at an angle of about 45 degrees with respect to the lines that defines the inner area; and a second additional pattern that is angled at an angle of about 15 degrees or more to about 35 degrees or less with respect to the lines that define the inner area.

In an embodiment, the second additional pattern may be symmetrical with respect to a virtual extension line passing through a center of the second additional pattern and extending in a diagonal direction with respect to each of the first direction and the second direction.

In an embodiment, in the second additional pattern, a portion of the second additional pattern, which faces the inner area, may have a predetermined curvature.

In an embodiment, a virtual first center line extending in the first direction and passing through a center of the first line may be defined, and the contact holes may overlap: a first contact hole adjacent to the third line and having a center disposed on the first center line; and a fourth line adjacent to the fourth line and having a center spaced apart from the first center line.

In an embodiment, the additional reinforcing pattern may be angled at an angle of about 45 degrees with respect to each of the lines that define the inner area.

In an embodiment, the additional reinforcing pattern may have the same shape as the reinforcing pattern.

In an embodiment, a virtual first center line extending in the first direction and passing through a center of the first line may be defined, and centers of the contact holes may overlap each other on the first center line.

In an embodiment, each of the contact holes may have a rhombus shape with respect to a plane defined in the first direction and the second direction.

In an embodiment, the display layer may include: a circuit layer including a transistor; a light emitting element layer including a first electrode connected to the transistor, a pixel defining layer, which exposes the first electrode and defines a corresponding emission area of the emission areas, an emission layer disposed on the first electrode, and a second electrode disposed on the emission layer; and an encapsulation layer configured to cover the light emitting element layer and alternately stacked with a plurality of inorganic and organic layers, wherein the sensor layer is directly disposed on the encapsulation layer.

According to an embodiment of the present inventive concepts, an electronic device includes a display layer comprising a plurality of emission areas that provide different colored light, respectively, and a non-emission area that is adjacent to the plurality of emission areas. A sensor layer includes a first sensing insulating layer disposed on the display layer, a first conductive layer disposed on the first sensing insulating layer, a second sensing insulating layer disposed on the first sensing insulating layer to cover the first conductive layer, and a second conductive layer disposed on the second sensing insulating layer and comprising mesh lines extending in first and second directions, that cross each other. The mesh lines comprise a plurality of lines. A reinforcing pattern is disposed on inner areas defined by the plurality of lines. The reinforcing pattern protrudes from portions of the plurality of lines which define each inner area of the inner areas.

BRIEF DESCRIPTION OF THE DRAWINGS

The accompanying drawings are included to provide a further understanding of the present inventive concepts, and are incorporated in and constitute a part of this specification. The drawings illustrate non-limiting embodiments of the present inventive concepts and, together with the description, serve to explain principles of the present inventive concepts. In the drawings.

DETAILED DESCRIPTION OF EMBODIMENTS

Figure 1:
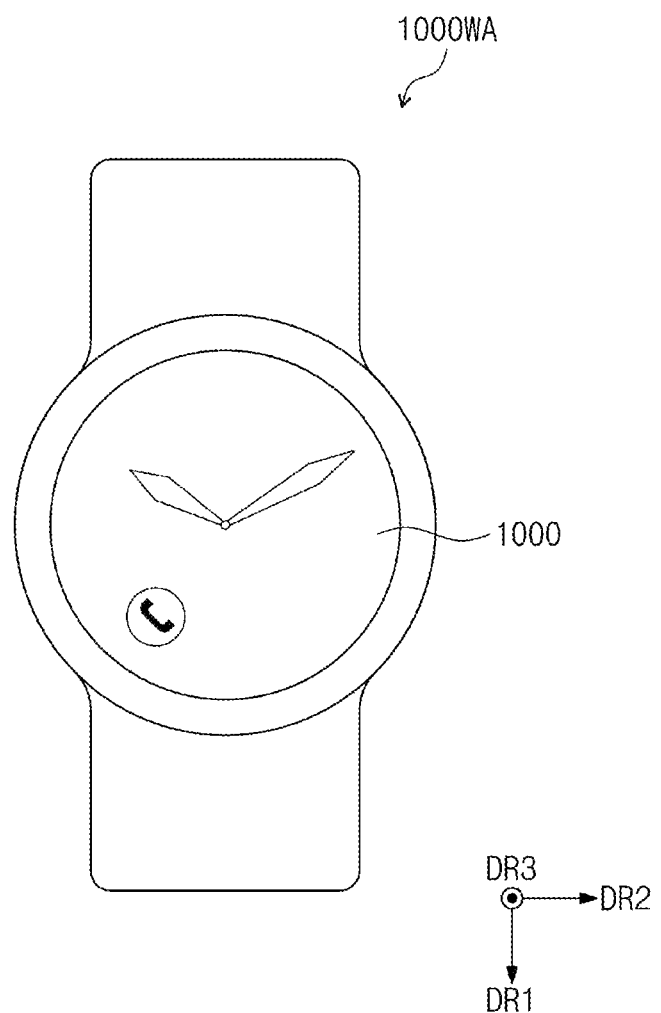
FIG. 1 is a plan view illustrating an application example of an electronic device according to an embodiment of the present inventive concepts.

In this specification, it will also be understood that when one component (or area, layer, portion, etc.) is referred to as being 'on', 'connected to', or 'coupled to' another component, it can be directly disposed/connected/coupled on/to the one component, or an intervening third component may also be present. When one component (or area, layer, portion, etc.) is referred to as being 'directly on', 'directly connected to', or 'directly coupled to' another component, no intervening third components may be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. In addition, terms such as terms defined in commonly used dictionaries should be interpreted as having a meaning consistent with the meaning in the context of the related technology, and unless explicitly defined here, they are not interpreted as too ideal or too formal sense.

The meaning of 'include' or 'comprise' specifies a property, a fixed number, a step, an operation, an element, a component or a combination thereof, but does not exclude other properties, fixed numbers, steps, operations, elements, components or combinations thereof. Hereinafter, embodiments of the present inventive concepts will be described with reference to the accompanying drawings.

Figure 2:
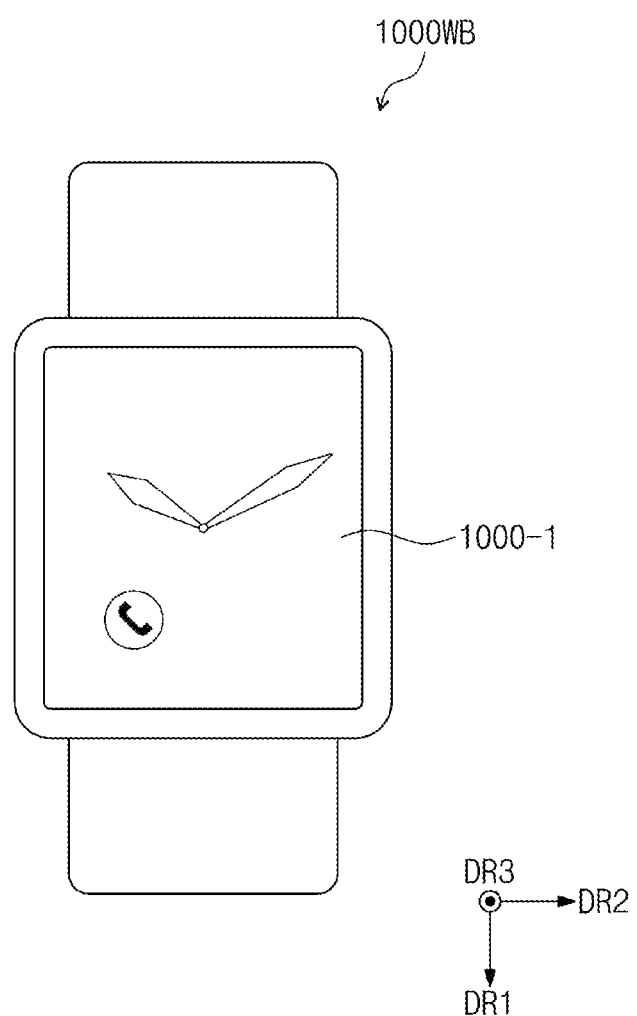
FIG. 2 is a plan view illustrating an application example of an electronic device according to an embodiment of the inventive concept.
Figure 3A:
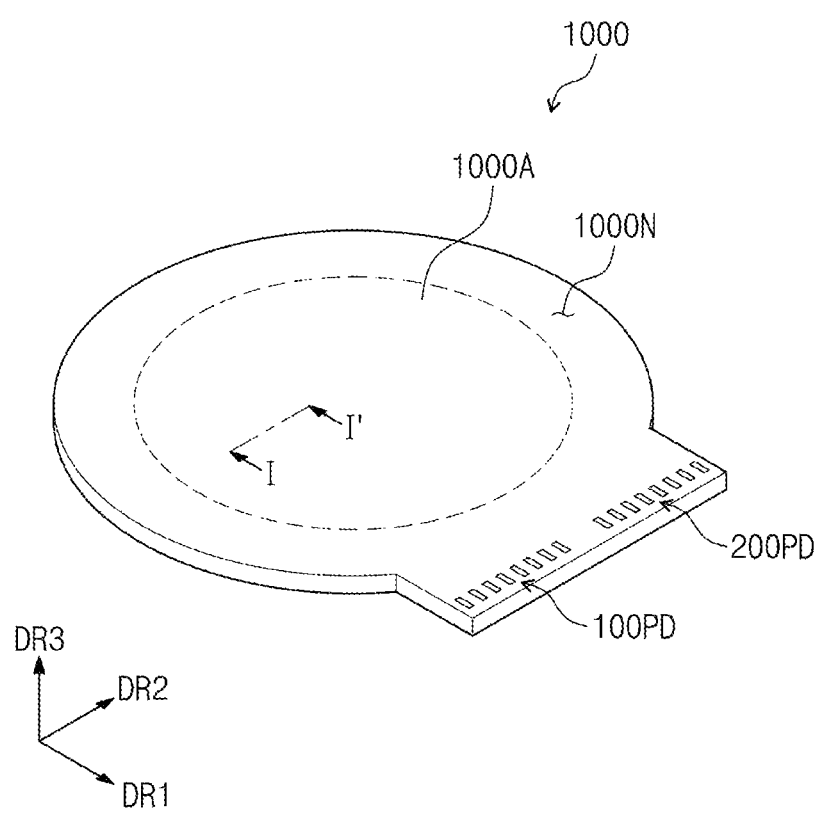
FIG. 3A is a perspective view of an electronic device according to an embodiment of the present inventive concepts.
Figure 3B:
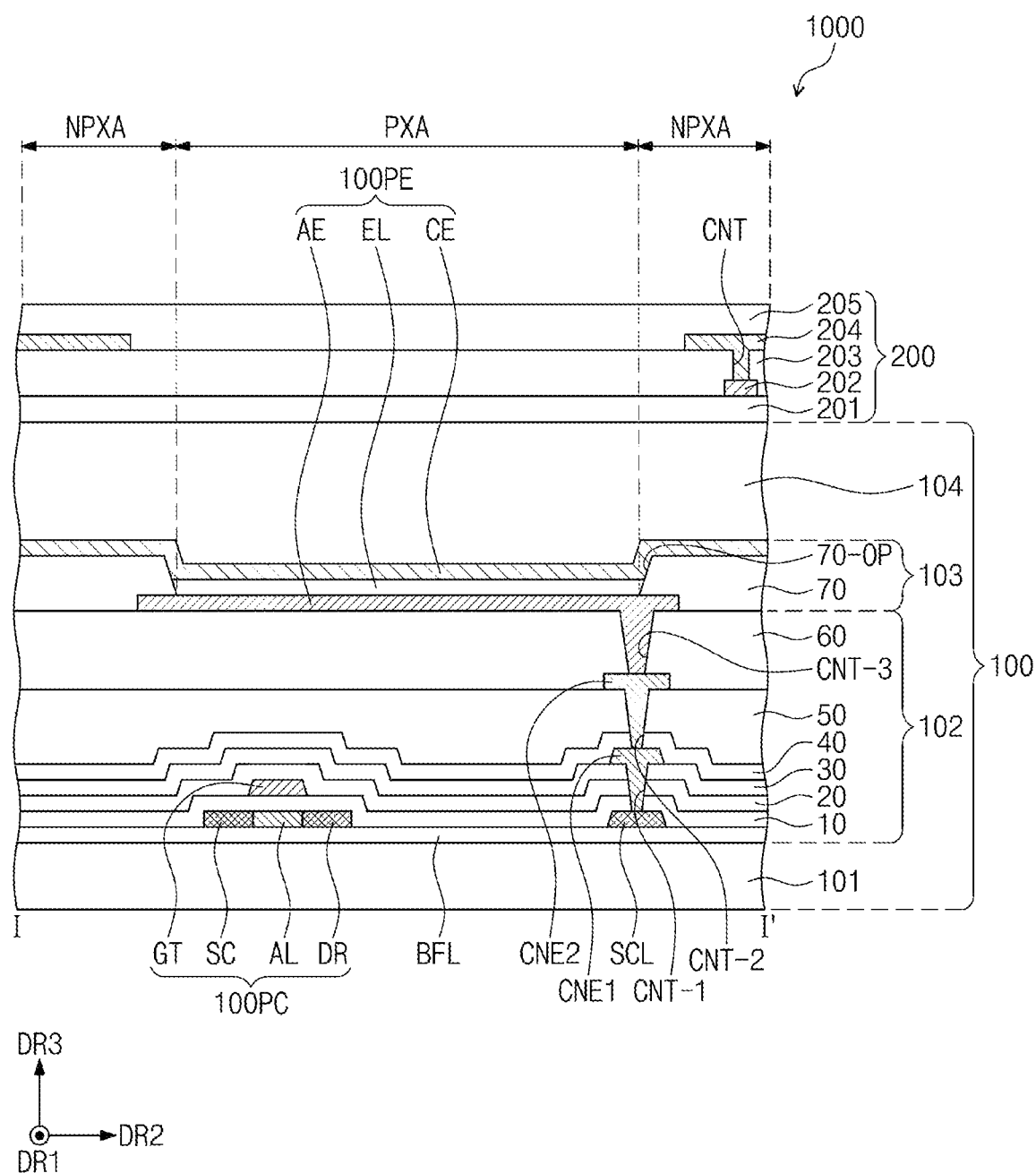
FIG. 3B is a cross-sectional view taken along line I-I' of FIG. 3A according to an embodiment of the present inventive concepts.

FIG. 1 is a plan view illustrating an application example of an electronic device according to an embodiment of the present inventive concepts. FIG. 2 is a plan view illustrating an application example of an electronic device according to an embodiment of the present inventive concepts. FIG. 3A is a perspective view of an electronic device according to an embodiment of the inventive concept. FIG. 3B is a cross-sectional view taken along line I-I' of FIG. 3A.

Referring to the embodiments of FIGS. 1 and 2, electronic devices 1000 and 1000-1 may be applied to the wearable devices 1000WA and 1000WB.

As shown in the embodiments of FIGS. 1-2, the electronic devices 1000 and 1000-1 may be smartwatches. However, embodiments of the present inventive concepts are not limited thereto and the electronic devices 1000 and 1000-1 may be applied to various different wearable devices. The electronic devices 1000 and 1000-1 may display one or more moving and/or still images, such as time information, weather information, telephone call information, or icons for performing various applications or operations. However, embodiments of the present inventive concepts are not limited thereto and the electronic devices 1000 and 1000-1 may display various different images. The user may operate the electronic devices 1000 and 1000-1 through a touch operation.

As shown in the embodiment of FIG. 1, an outer appearance of the wearable device 1000WA illustrated in FIG. 1 may have a circular shape in a plan view (e.g., in a plane defined in the first and second directions DR1, DR2). Also, as shown in the embodiment of FIG. 2, an outer appearance of the wearable device 1000WB may have a square shape with rounded corners in a plan view. However, embodiments of the present inventive concepts are not limited thereto and the shape of the wearable device in a plan view may vary.

Hereinafter, a description will be made based on the electronic device 1000 applied to the wearable device 1000WA having the circular shape for convenience of explanation. However, the description of all components of the electronic device 1000 may also be applied to the wearable device 1000WB having the square shape or another shape.

Referring to the embodiments of FIGS. 3A and 3B, an active area 1000A and a peripheral area 1000N may be defined on the electronic device 1000. The peripheral area 1000N may be disposed adjacent to the active area 1000A to surround the active area 1000A. For example, as shown in the embodiment of FIG. 3A, the peripheral area 1000N may completely surround the active area 1000A (e.g., in the first and second directions DR1, DR2). However, embodiments of the present inventive concepts are not limited thereto.

The electronic device 1000 may display an image through the active area 1000A and sense an input that is applied from the outside. For example, in an embodiment, the input may be a user's input, such as a touch of the user's finger, etc.

The active area 1000A may include a plane defined by a first direction DR1 and a second direction DR2. However, embodiments of the present inventive concepts are not limited thereto. For example, the active area 1000A may include a curved surface or may include both a curved surface and a flat surface. In this specification, a third direction DR3 crossing both the first direction DR1 and the second direction DR2 may be referred to as a thickness direction of the electronic device 1000.

The electronic device 1000 may include a display layer 100 and a sensor layer 200.

The display layer 100 may be configured to substantially generate an image. In an embodiment, the display layer 100 may be an emission-type display layer, such as an organic emission display layer, a non-emission display layer, a quantum dot display layer, or a micro LED display layer. In this embodiment, the display layer 100 is described as the organic emission display layer for convenience of explanation. However, embodiments of the present inventive concepts are not limited thereto.

The sensor layer 200 may be disposed on the display layer 100. The sensor layer 200 may sense an external input applied from the outside. The external input may be a user's input. The user's input may be provided in various forms. For example, the user's input may include an external input (e.g., hovering) applied to be proximate or adjacent by a predetermined distance to the electronic device 1000 as well as to be in direct contact with a portion of the human body such as the user's hand. Also, the external input may be provided as various forms such as force, a pressure, light, and the like and is not limited to any one embodiment.

In an embodiment, the sensor layer 200 may be disposed on the display layer 100 through a continuous process. In this embodiment, the sensor layer 200 may be expressed as being 'directly' disposed on the display layer 100. The direct disposition may mean that a third component is not disposed between the sensor layer 200 and the display layer 100. For example, a separate adhesive member may not be disposed between the sensor layer 200 and the display layer 100 (e.g., in the third direction DR3).

As illustrated in the embodiment of FIG. 3A, the electronic device 1000 may include display pads 100PD electrically connected to the display layer 100 and sensor pads 200PD (hereinafter, referred to as pads) electrically connected to the sensor layer 200. In an embodiment, one printed circuit film may be attached to the display pads 100PD and the pads 200PD. However, embodiments of the present inventive concepts are not limited thereto. For example, in an embodiment, a first printed circuit film may be attached to the display pads 100PD, and a second printed circuit film may be attached to the pads 200PD. The printed circuit film may be connected to a main board.

Referring to the embodiment of FIG. 3B, the display layer 100 may include a base layer 101, a circuit layer 102, a light emitting element layer 103, and an encapsulation layer 104.

The base layer 101 may be a base layer that provides a base surface on which a circuit layer 102 is disposed. In an embodiment, the base layer 101 may be a glass substrate, a metal substrate, a plastic substrate, or a polymer substrate. For example, in an embodiment, the base layer 101 may be an inorganic layer, an organic layer, or a composite layer.

The base layer 101 may have a multilayered structure. For example, in an embodiment, the base layer 101 may include a first synthetic resin layer, a silicon oxide ($SiO_x$) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer. However, embodiments of the present inventive concepts are not limited thereto. For example, in an embodiment, the base layer 101 may include a first synthetic resin layer, an adhesive layer, and a second synthetic resin layer.

Each of the first and second synthetic resin layers may include a polyimide-based resin. Also, each of the first and second synthetic resin layers may include at least one compound selected from an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In this specification, the "~~"-based resin means as including a functional group of "~~".

The circuit layer 102 may be disposed on the base layer 101 (e.g., directly thereon in the third direction DR3). The circuit layer 102 may include an insulating layer, a semiconductor pattern, a conductive pattern, and a signal line. In an embodiment, the insulating layer, the semiconductor layer, and the conductive layer may be formed on the base layer 101 in a manner such as coating or vapor deposition, and the insulating layer, the semiconductor layer, and the conductive layer may then be selectively patterned through a plurality of photolithography processes. Thereafter, the semiconductor pattern, the conductive pattern, and the signal line provided in the circuit layer 102 may be provided. However, embodiments of the present inventive concepts are not limited thereto.

In an embodiment, at least one inorganic layer may be disposed on a top surface of the base layer 101. In an embodiment, the inorganic layer may include at least one compound selected from aluminum oxide, titanium oxide, silicon oxide, silicon nitride, silicon oxynitride, zirconium oxide, and hafnium oxide. The inorganic layer may be provided as a multilayer. The multilayered inorganic layer may constitute a barrier layer and/or a buffer layer. In this embodiment, the display layer 100 is illustrated as including a buffer layer BFL.

The buffer layer BFL may increase bonding force between the base layer 101 and the semiconductor pattern. In an embodiment, the buffer layer BFL may include a silicon oxide layer and a silicon nitride layer, and the silicon oxide layer and the silicon nitride layer may be alternately stacked. However, embodiments of the present inventive concepts are not limited thereto.

The semiconductor pattern may be disposed on the buffer layer BFL (e.g., directly thereon in the third direction DR3). In an embodiment, the semiconductor pattern may include polysilicon. However, embodiments of the present inventive concepts are not limited thereto. For example, the semiconductor pattern may include amorphous silicon or metal oxide.

FIG. 3B illustrates merely a portion of the semiconductor pattern. For example, the semiconductor pattern may be further disposed on other areas not shown in FIG. 3B. In an embodiment, the semiconductor pattern may be arranged in a specific rule over pixels. The semiconductor pattern has different electrical properties depending on whether the semiconductor pattern is doped. The semiconductor pattern may include a doped region and a non-doped region. The doped region may be doped with an N-type dopant or a P-type dopant. A P-type transistor may include a doped region doped with the P-type dopant, and an N-type transistor may include a doped region doped with the N-type dopant.

The doped region may have conductivity that is greater than the conductivity of a non-doped region and may substantially act as an electrode or a signal line. The non-doped region may substantially correspond to an active (or a channel) of the transistor. For example, a portion of the semiconductor pattern may be an active of the transistor, another portion may be a source or drain of the transistor, and further another portion may be a connection electrode or a connection signal line.

In an embodiment, each of the pixels may have an equivalent circuit including seven transistors, one capacitor, and a light emitting element. However, embodiments of the present inventive concepts are not limited thereto and an equivalent circuit diagram of the pixel may be modified in various forms. In FIG. 3B, one transistor 100PC and one light emitting element 100PE provided in the pixel are exemplarily illustrated.

A source SC, an active AL, and a drain DR of the transistor 100PC may be provided from the semiconductor pattern. The source SC and the drain DR may extend in opposite directions from the active AL on a cross-section. For example, as shown in the embodiment of FIG. 3B, the source SC and the drain DR may be spaced apart from each other in the second direction DR2 with the active AL disposed therebetween. However, embodiments of the present inventive concepts are not limited thereto. FIG. 3B illustrates a portion of the connection signal line SCL formed from the semiconductor pattern. In an embodiment, the connection signal line SCL may be connected to the drain DR of the transistor 100PC.

A first insulating layer 10 may be disposed on the buffer layer BFL (e.g., directly thereon in the third direction DR3). In an embodiment, the first insulating layer 10 commonly overlaps the plurality of pixels to cover the semiconductor pattern. The first insulating layer 10 may include an inorganic layer and/or an organic layer and have a single-layered or multilayered structure. For example, in an embodiment, the first insulating layer 10 may include at least one compound selected from aluminum oxide, titanium oxide, silicon oxide, silicon nitride, silicon oxynitride, zirconium oxide, and hafnium oxide. In this embodiment, the first insulating layer 10 may include a single-layered silicon oxide layer. The insulating layer of the circuit layer 102, which will be described later, as well as the first insulating layer 10 may be an inorganic layer and/or an organic layer and may have a single-layered or a multilayered structure. The inorganic layer may include at least one of the above-described materials, but is not limited thereto.

A gate GT of the transistor 100PC is disposed on the first insulating layer 10 (e.g., directly thereon in the third direction DR3). In an embodiment, the gate GT may be a portion of a metal pattern. The gate GT overlaps the active AL (e.g., in the third direction DR3). In the process of doping the semiconductor pattern, the gate GT may function as a mask.

The second insulating layer 20 may be disposed on the first insulating layer 10 (e.g., directly thereon in the third direction DR3) to cover the gate GT. In an embodiment, the second insulating layer 20 may commonly overlap the pixels. The second insulating layer 20 may be an inorganic layer and/or an organic layer and have a single-layered or multilayered structure. In this embodiment, the second insulating layer 20 may be a single-layered silicon oxide or silicon nitride layer.

The third insulating layer 30 may be disposed on the second insulating layer 20 (e.g., directly thereon in the third direction DR3). In this embodiment, the third insulating layer 30 may be a single-layered silicon oxide layer or silicon nitride layer.

A first connection electrode CNE1 may be disposed on the third insulating layer 30 (e.g., directly thereon in the third direction DR3). As shown in the embodiment of FIG. 3B, the first connection electrode CNE1 may be connected to the connection signal line SCL through a first contact hole CNT-1 passing through the first to third insulating layers 10 to 30.

A fourth insulating layer 40 may be disposed on the third insulating layer 30 (e.g., directly thereon in the third direction DR3). In an embodiment, the fourth insulating layer 40 may be a single-layered silicon oxide layer. However, embodiments of the present inventive concepts are not limited thereto. A fifth insulating layer 50 may be disposed on the fourth insulating layer 40 (e.g., directly thereon in the third direction DR3). In an embodiment, the fifth insulating layer 50 may be an organic layer.

A second connection electrode CNE2 may be disposed on the fifth insulating layer 50 (e.g., directly thereon in the third direction DR3). As shown in the embodiment of FIG. 3B, the second connection electrode CNE2 may be connected to the first connection electrode CNE1 through a second contact hole CNT-2 passing through the fourth insulating layer 40 and the fifth insulating layer 50.

A sixth insulating layer 60 may be disposed on the fifth insulating layer 50 (e.g., directly thereon in the third direction DR3) to cover the second connection electrode CNE2. In an embodiment, the sixth insulating layer 60 may be an organic layer.

A light emitting element layer 103 may be disposed on the circuit layer 102 (e.g., directly thereon in the third direction DR3). The light emitting element layer 103 may include a light emitting element 100PE. For example, in an embodiment, the light emitting element layer 103 may include an organic light emitting material, quantum dots, quantum rods, or micro LEDs. Hereinafter, the light emitting element 100PE is described as an example of an organic light emitting element. However, embodiments of the present inventive concepts are not limited thereto.

The light emitting element 100PE may include a first electrode AE, an emission layer EL, and a second electrode CE.

The first electrode AE may be disposed on the sixth insulating layer 60 (e.g., directly thereon in the third direction DR3). As shown in the embodiment of FIG. 3B, the first electrode AE may be connected to the second connection electrode CNE2 through a third contact hole CNT-3 passing through the sixth insulating layer 60.

A pixel defining layer 70 may be disposed on the sixth insulating layer 60 to cover a portion of the first electrode AE. An opening 70-OP is defined in the pixel defining layer 70. The opening 70-OP of the pixel defining layer 70 exposes at least a portion of the first electrode AE. For example, as shown in the embodiment of FIG. 3B, the pixel defining layer 70 may cover lateral ends of the first electrode AE and the opening 70-OP may expose a central portion of the first electrode AE. However, embodiments of the present inventive concepts are not limited thereto.

The active area 1000A of the electronic device 1000 according to an embodiment of the present inventive concepts may include an emission area PXA and a non-emissive area NPXA adjacent to the emission area PXA. The non-emission area NPXA may surround the emission area PXA. In this embodiment, the emission area PXA may correspond to the partial area of the first electrode AE, which is exposed by the opening 70-OP and may be defined as a surface area of the opening 70-OP. A plurality of emission areas PXA may be arranged on the active area 1000A. This will be described later.

The emission layer EL may be disposed on the first electrode AE. The emission layer EL may be disposed on an area corresponding to the opening 70-OP. For example, the emission layer EL may be formed by being patterned to overlap the first electrode AE (e.g., in the third direction DR3) and lateral ends of the emission layer EL may directly contact the pixel defining layer 70. In an embodiment, each of the emission layers EL may emit light of at least one color of blue, red, or green. However, embodiments of the present inventive concept are not limited thereto. For example, the colors emitted by one or more of the emission layers EL may be various other colors. Additionally, the emission layer EL may be commonly provided to be connected to the pixels. In this embodiment, the emission layer EL may provide blue light or white light.

The second electrode CE may be disposed on the emission layer EL. In an embodiment, the second electrode CE may have an integrated shape and commonly disposed on the plurality of pixels.

In an embodiment, a hole control layer may be disposed between the first electrode AE and the emission layer EL. The hole control layer may be commonly disposed on the emission area PXA and the non-emission area NPXA. The hole control layer may include a hole transport layer and may further include a hole injection layer. In an embodiment, an electron control layer may be disposed between the emission layer EL and the second electrode CE. The electron control layer may include an electron transport layer and may further include an electron injection layer. The hole control layer and the electron control layer may be commonly formed on the plurality of pixels by using an open mask.

An encapsulation layer 104 may be disposed on the light emitting element layer 103 (e.g., directly thereon in the third direction DR3). In an embodiment, the encapsulation layer 104 may include an inorganic layer, an organic layer, and an inorganic layer, which are sequentially laminated. However, embodiments of the present inventive concepts are not limited thereto and the layers constituting the encapsulation layer 104 may vary. For example, the encapsulation layer 104 may include at least one inorganic layer and at least one organic layer and the numbers of layers of the inorganic layer and the organic layer may vary.

The inorganic layers may protect the light emitting element layer 103 against moisture and oxygen, and the organic layer may protect the light emitting element layer 103 against foreign substances such as dust particles. In an embodiment, the inorganic layers may include a silicon nitride layer, a silicon oxy nitride layer, a silicon oxide layer, a titanium oxide layer, or an aluminum oxide layer. However, embodiments of the present inventive concepts are not limited thereto. The organic layer may include an acrylic-based organic layer. However, embodiments of the present inventive concepts are not limited thereto.

As shown in the embodiment of FIG. 3B, the sensor layer 200 may include a first sensing insulating layer 201, a first conductive layer 202, a second sensing insulating layer 203, a second conductive layer 204, and a cover insulating layer 205.

In an embodiment, the first sensing insulating layer 201 may be an inorganic layer including at least one compound selected from silicon nitride, silicon oxynitride, and silicon oxide. However, embodiments of the present inventive concepts are not limited thereto. For example, in an embodiment, the first sensing insulating layer 201 may be an organic layer including an epoxy resin, an acrylic resin, or an imide-based resin. The first sensing insulating layer 201 may have a single-layered structure or a multilayered structure in which a plurality of layers are laminated in the third direction DR3.

Each of the first conductive layer 202 and the second conductive layer 204 may have a single-layered structure or a multilayered structure in which a plurality of layers are laminated in the third direction DR3.

In an embodiment, the conductive layer having the single-layered structure may include a metal layer including molybdenum, silver, titanium, copper, aluminum, or an alloy thereof.

The conductive layer having the multilayered structure may include metal layers. In an embodiment, the metal layers may have a three-layered structure of titanium/aluminum/titanium. The conductive layer having the multilayered structure may include at least one metal layer and at least one transparent conductive layer.

In an embodiment in which each of the first conductive layer 202 and the second conductive layer 204 includes a metal layer, the first conductive layer 202 and the second conductive layer 204 may be opaque. Thus, the first conductive layer 202 and the second conductive layer 204 may be patterned to non-overlap the emission area PXA and overlap the non-emission area NPXA (e.g., in the third direction DR3).

In an embodiment, at least one of the second sensing insulating layer 203 or the cover insulating layer 205 may include an inorganic layer. For example, in an embodiment, the inorganic layer may include at least one compound selected from aluminum oxide, titanium oxide, silicon oxide, silicon nitride, silicon oxynitride, zirconium oxide, and hafnium oxide.

In an embodiment, at least one of the second sensing insulating layer 203 or the cover insulating layer 205 may include an organic layer. For example, in an embodiment, the organic layer may include at least one material selected from an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

A portion of the first conductive layer 202 and a portion of the second conductive layer 204 may be connected to each other through a contact hole CNT defined in the second sensing insulating layer 203.

Figure 4A:
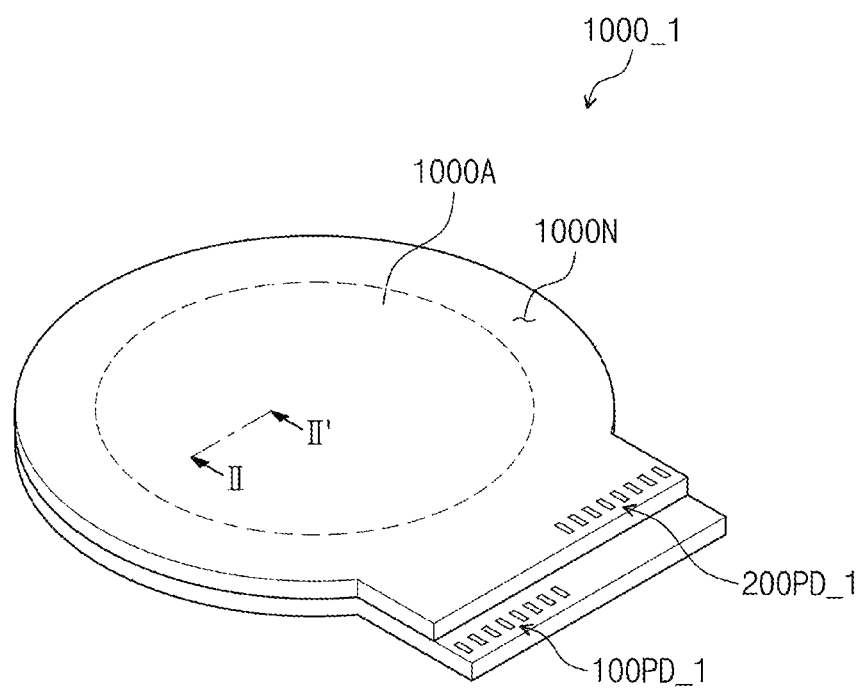
FIG. 4A is a perspective view of an electronic device according to an embodiment of the present inventive concepts.
Figure 4B:
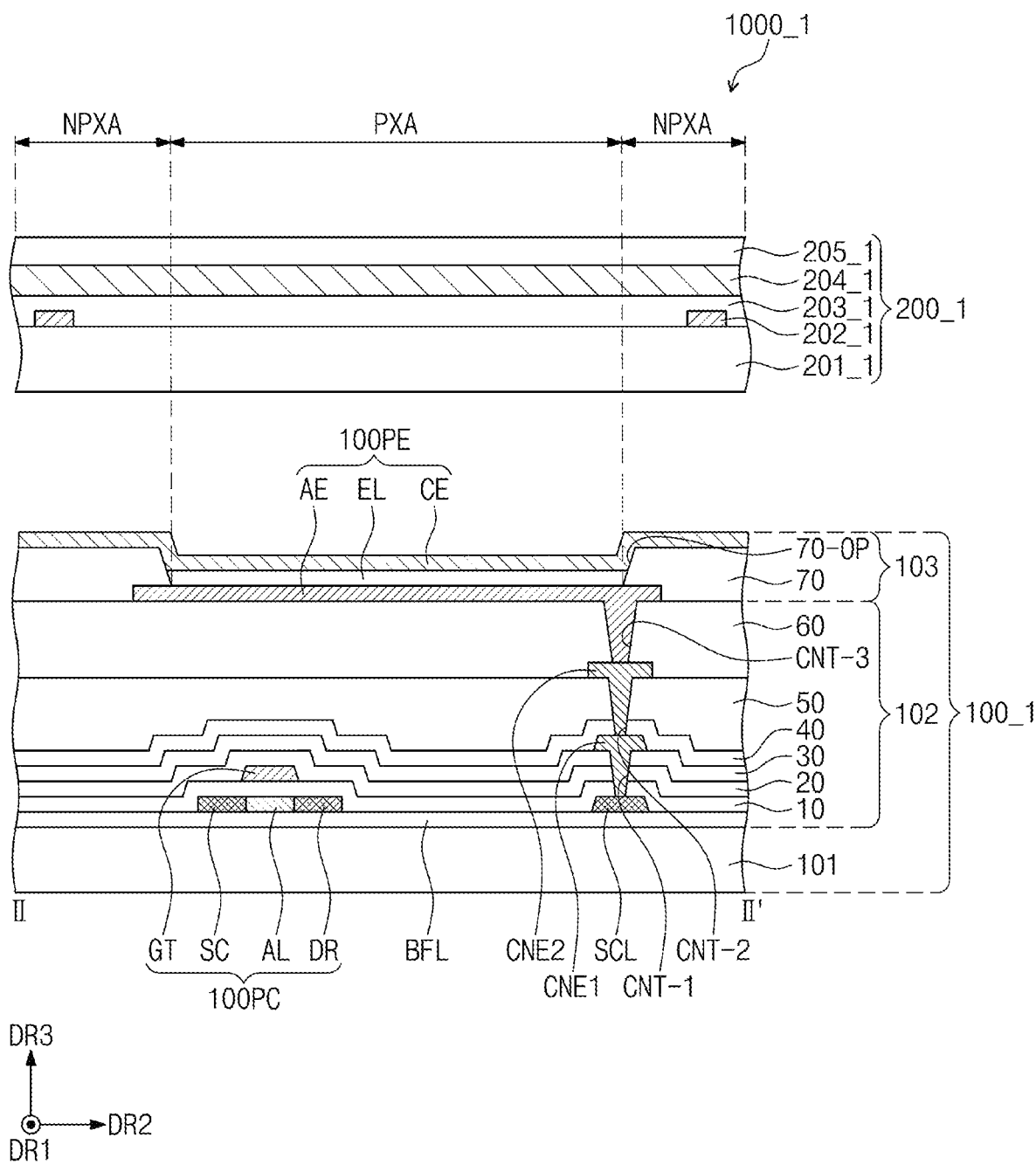
FIG. 4B is a cross-sectional view taken along line II-II' of FIG. 4A according to an embodiment of the present inventive concepts.

FIG. 4A is a perspective view of an electronic device according to an embodiment of the present inventive concepts. FIG. 4B is a cross-sectional view taken along line II-II' of FIG. 4A.

Referring to the embodiments of FIGS. 4A and 4B, an electronic device 1000_1 may include a first substrate 100_1 and a second substrate 200_1. The first substrate 100_1 may be referred to as a display layer, and the second substrate 200_1 may be referred to as a sensor layer.

In an embodiment, the first substrate 100_1 and the second substrate 200_1 may be coupled to each other by a coupling member. For example, the coupling member may be disposed between the first substrate 100_1 and the second substrate 200_1 (e.g., in the third direction DR3) and may be disposed on the peripheral area 1000N. The coupling member may include an inorganic material or an organic material. For example, in an embodiment, the inorganic material may include a frit seal, and the organic material may include a photocurable resin or a photoplastic resin. However, embodiments of the present inventive concepts are not limited thereto and a material forming the coupling member may vary.

The first substrate 100_1 may include a base layer 101, a circuit layer 102, and a light emitting element layer 103. The description of the base layer 101, the circuit layer 102, and the light emitting element layer 103 has been previously described with reference to the embodiments of FIGS. 3A and 3B, and thus a repeated description will be omitted for convenience of explanation.

The second substrate 200_1 may include a base substrate 201_1, a first conductive layer 202_1, a second sensing insulating layer 203_1, a second conductive layer 204_1, and a cover insulating layer 205_1.

In an embodiment, the base substrate 201_1 may be a glass substrate, a metal substrate, or a polymer substrate. However, embodiments of the present inventive concepts are not limited thereto. For example, in an embodiment, the base substrate 201_1 may be an inorganic layer, an organic layer, or a composite layer.

The first conductive layer 2021 may include a metal layer provided in the first conductive layer 202 described in the embodiment of FIG. 3B. In this embodiment, the second conductive layer 204_1 may include a transparent conductive layer. In this case, the second conductive layer 204_1 may overlap both the emission area PXA and the non-emissive area NPXA (e.g., in the third direction DR3).

In an embodiment, the transparent conductive layer provided in the second conductive layer 2041 may include transparent conductive oxide such as indium tin oxide (ITO), indium zinc oxide (IZO), zinc oxide (ZnO), indium zinc tin oxide (IZTO), and the like. In addition, the transparent conductive layer may include conductive polymers such as PEDOT, metal nanowires, graphene, and the like.

In an embodiment, at least one insulating layer may be further disposed between the base substrate 201_1 and the first conductive layer 202_1. The at least one insulating layer may be formed directly on the base substrate 201_1 or may be bonded to the base substrate 201_1 through an adhesive layer. The adhesive member may include a general adhesive or adhesive agent.

The first substrate 1001 may include display pads 100PD_1, and the second substrate 200_1 may include sensor pads 200PD_1 (hereinafter, referred to as pads). In an embodiment, a first printed circuit film may be attached to the display pads 100PD_1, and a second printed circuit film may be attached to the pads 200PD_1.

The display pads 100PD_1 are electrically connected to the circuit layer 102 to provide a signal to the circuit layer 102. The sensor pads 200PD_1 are electrically connected to the first conductive layer 202_1 and the second conductive layer 204_1 to provide signals to the first conductive layer 202_1 and the second conductive layer 204_1 or to receive signals from the first conductive layer 202_1 and the second conductive layer 204_1.

Figure 5:
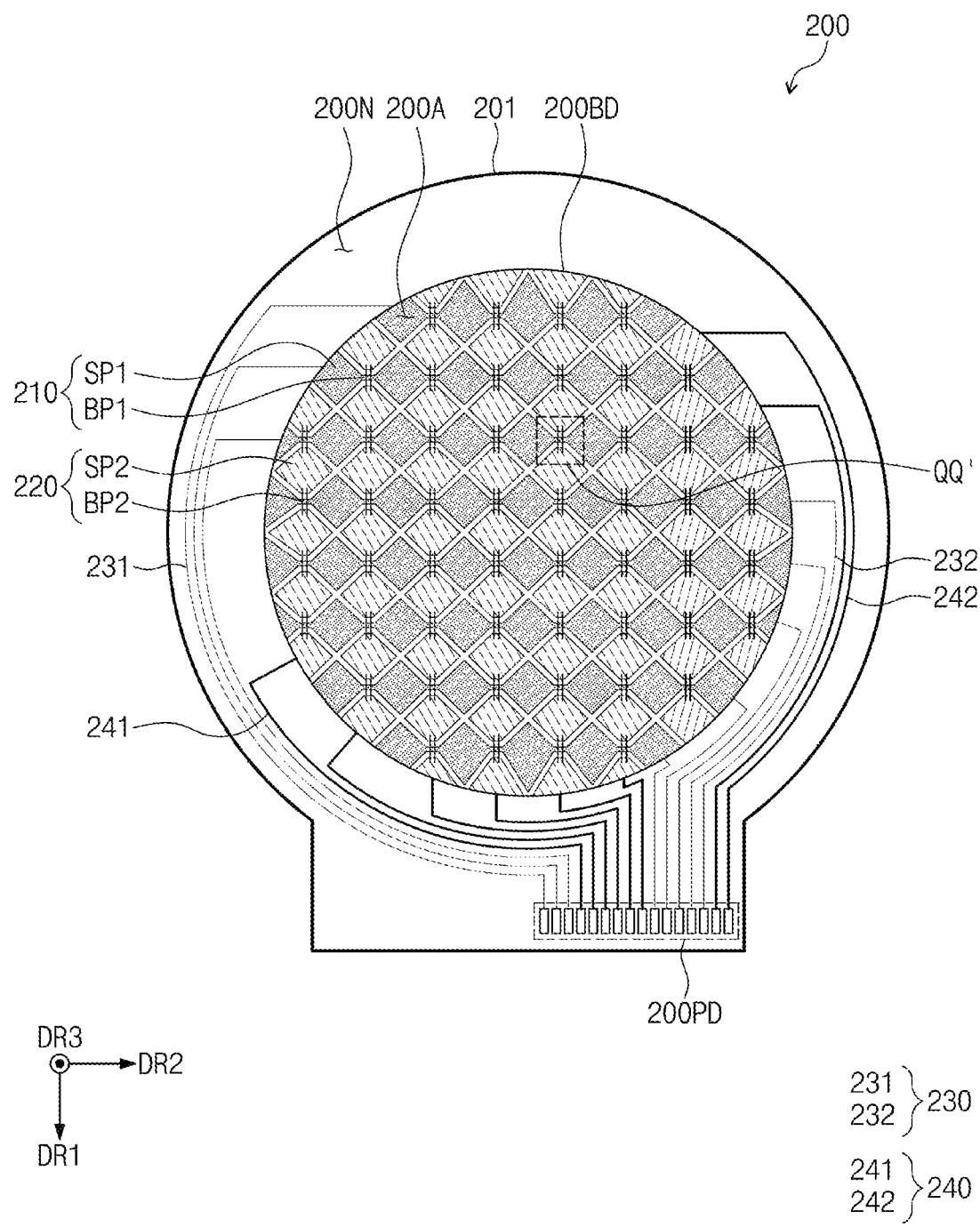
FIG. 5 is a plan view of a sensor layer according to an embodiment of the present inventive concepts.
Figure 6:
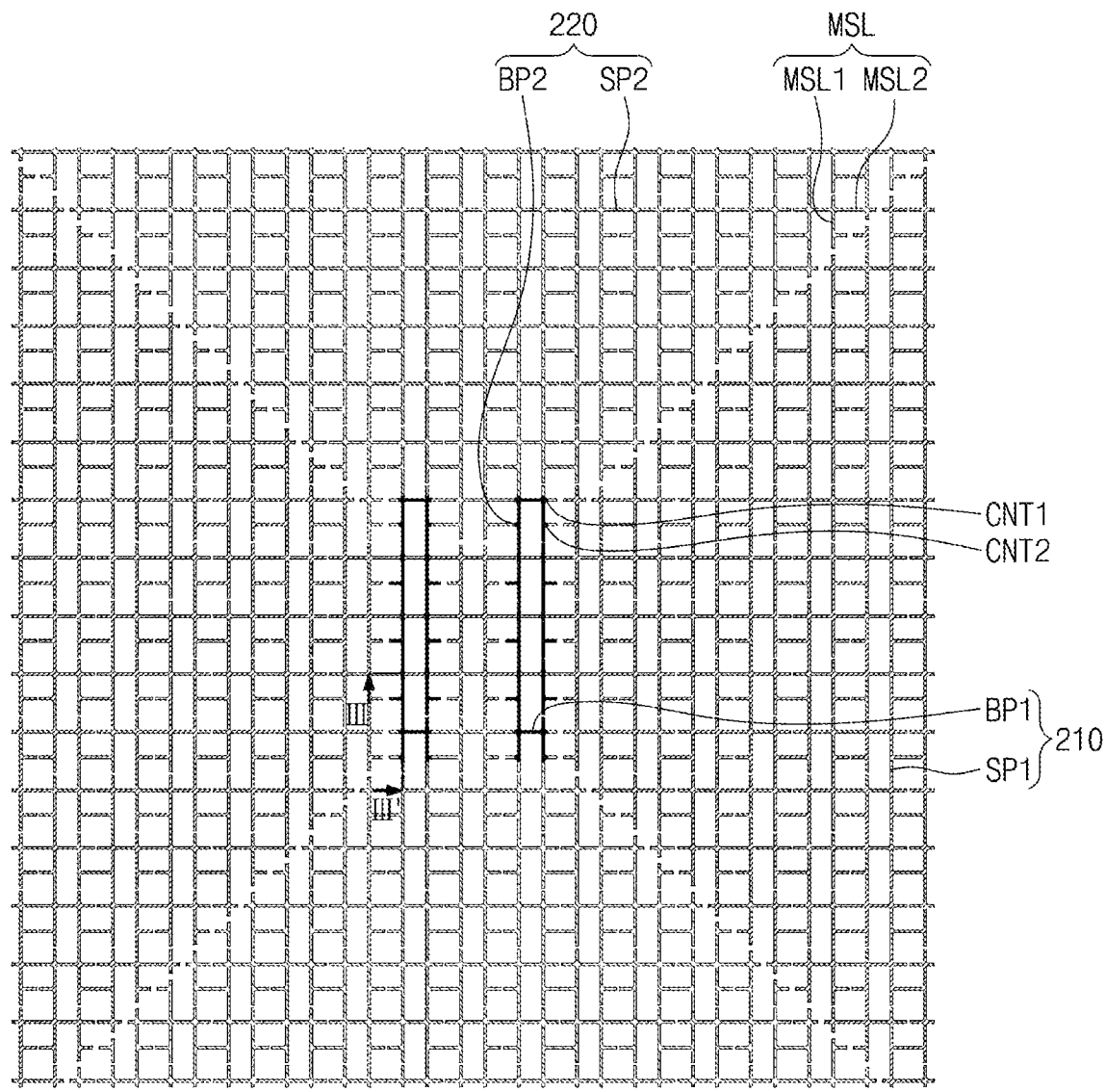
FIG. 6 is a plan view illustrating an area QQ' of FIG. 5 according to an embodiment of the present inventive concepts.
Figure 7:
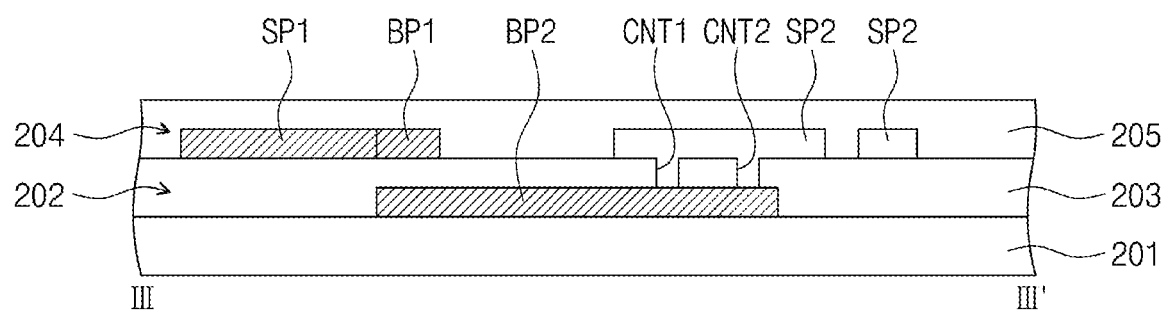
FIG. 7 is a cross-sectional view taken along line III-III' of FIG. 6 according to an embodiment of the present inventive concepts.

FIG. 5 is a plan view of the sensor layer according to an embodiment of the present inventive concepts. FIG. 6 is a plan view illustrating an area QQ' of FIG. 5. FIG. 7 is a cross-sectional view taken along line III-III' of FIG. 6. The same/similar reference numerals are used for the same/similar configurations as in the embodiments of FIGS. 1 to 4B, and redundant descriptions are omitted for convenience of explanation.

Referring to FIG. 5, a sensing area 200A and a peripheral area 200N may be defined on the sensor layer 200. The sensing area 200A is an area that senses an external input and may overlap the active area 1000A of the embodiment of FIG. 3A (e.g., in the third direction DR3). The peripheral area 200N surrounds the sensing area 200A and may overlap the peripheral area 1000N of the embodiment of FIG. 3A (e.g., in the third direction DR3). In this embodiment, a boundary 200BD between the sensing area 200A and the peripheral area 200N may be a circle in a plan view.

The sensor layer 200 according to an embodiment of the present inventive concepts may include a first sensing electrode 210, a second sensing electrode 220, a plurality of trace lines 231, 232, 241, and 242, and sensor pads 200PD.

The first sensing electrode 210 extends in the second direction DR2. The first sensing electrode 210 may be provided in plurality and may be arranged in the first direction DR1. The first sensing electrode 210 includes a plurality of first sensing patterns SP1 arranged in the second direction DR2 and a first bridge pattern BP1 disposed between the first sensing patterns SP1 (e.g., in the second direction DR2) to connect adjacent first sensing patterns SP1 to each other.

The second sensing electrode 220 may be disposed to be insulated from the first sensing electrode 210. The second sensing electrode 220 extends in the first direction DR1. The second sensing electrode 220 may be provided in plurality and may be arranged in the second direction DR2. The second sensing electrode 220 includes a plurality of second sensing patterns SP2 arranged in the first direction DR1 and a second bridge pattern BP2 disposed between the second sensing patterns SP2 (e.g., in the first direction DR1) to connect adjacent second sensing patterns SP2 to each other.

In an embodiment, the sensor layer 200 may sense a variation in mutual capacitance between the first sensing electrode 210 and the second sensing electrode 220 to sense the external input or sense a variation in self capacitance of each of the first sensing electrode 210 and the second sensing electrode 220 to sense the external input. The sensor layer 200 according to an embodiment of the present inventive concepts may sense the external input TC in various manners, but is not limited to one embodiment.

The trace lines 231, 232, 241, and 242 may include first trace lines 231 and 232 connected to the corresponding first sensing electrode 210 among the first sensing electrodes 210 and second trace lines 241 and 242 connected to the corresponding second sensing electrode 220 among the second sensing electrodes 220.

First first trace lines 231 may be connected to corresponding ends of the first sensing electrodes 210 disposed on a first side among the first sensing electrodes 210, and second first trace lines 232 may be connected to corresponding other ends of the first sensing electrodes 210 disposed on a second side among the first sensing electrodes 210.

First second trace lines 241 may be connected to corresponding ends of the second sensing electrodes 220 disposed on a first side among the second sensing electrodes 220, and second second trace lines 242 may be connected to corresponding other ends of the second sensing electrodes 220 disposed on a second side among the second sensing electrodes 220. The trace lines 231, 232, 241, 242 may be connected to corresponding sensor pads 200PD.

The connection relationship between the trace lines 231, 232, 241, and 242 and the first and second sensing electrodes 210 and 220 is not limited thereto and may be connected in various manners, but is not limited to any one embodiment.

In the embodiment of FIG. 6, some of the first sensing patterns SP1, the first bridge pattern BP1, the second sensing patterns SP2, and the second bridge pattern BP2 among the first and second sensing electrodes 210 and 220 are illustrated to be enlarged.

Referring to the embodiments of FIGS. 6 and 7, components provided in the first sensing electrode 210 and the second sensing electrode 220 according to an embodiment of the present inventive concepts may be provided in any one of the first conductive layer 202 and the second conductive layer 204, which are illustrated in the embodiment of FIG. 3B.

In an embodiment, the second conductive layer 204 described with reference to the embodiment of FIG. 3B may include the first sensing patterns SP1 of the first sensing electrode 210, the first bridge pattern BP1, and the second sensing patterns SP2 of the second sensing electrode 220. The first sensing patterns SP1 and the first bridge pattern BP1 may be patterned into a substantially integral shape. A portion of the first bridge pattern BP1 may overlap the second bridge pattern BP2 (e.g., in the third direction DR3).

In an embodiment, the first conductive layer 202 described with reference to the embodiment of FIG. 3B may include a second bridge pattern BP2 of the second sensing electrode 220.

The second sensing patterns SP2 and the second bridge pattern BP2 may be connected to each other by first and second contact holes CNT1 and CNT2. The contact hole CNT defined in the second sensing insulating layer 203 described in FIG. 3B may correspond to any one of the first and second contact holes CNT1 and CNT2.

The trace lines 231, 232, 241 and 242 may be provided in at least one of the first conductive layer 202 or the second conductive layer 204. For example, the trace lines 231, 232, 241 and 242 may be provided in any one of the first conductive layer 202 and the second conductive layer 204 or may be connected to each other by the contact hole, such as the first or second contact holes CNT1, CNT2, defined in the second sensing insulating layer 203 so as to be provided in two layers. However, embodiments of the present inventive concepts are not limited thereto.

In an embodiment of the present inventive concepts, the first sensing patterns SP1, the first bridge pattern BP1, and the second sensing patterns SP2, which are provided in the second conductive layer 204, may be provided as a first mesh line MSL1 and a second mesh line MSL2.

The first mesh line MSL1 may extend in the first direction DR1, and the second mesh line MSL2 may extend in the second direction DR2. However, embodiments of the present inventive concepts are not limited thereto and the first and second mesh lines MSL1, MSL2 may respectively extend in various other directions that cross each other. The first mesh line MSL1 and the second mesh line MSL2 may non-overlap the emission area PXA described in the embodiment of FIG. 3B and may overlap the non-emissive area NPXA (e.g., in the third direction DR3).

An area surrounded by the first mesh line MSL1 and the second mesh line MSL2 may surround at least a portion of the emission area PXA. This will be described in more detail below.

According to an embodiment of the present inventive concepts, even if the second conductive layer 204 including a metal is disposed on the display layer 100, the second conductive layer 204 may not affect light provided from the emission layer EL. Therefore, the electronic device 1000 having increased light extraction efficiency may be provided.

Figure 8:
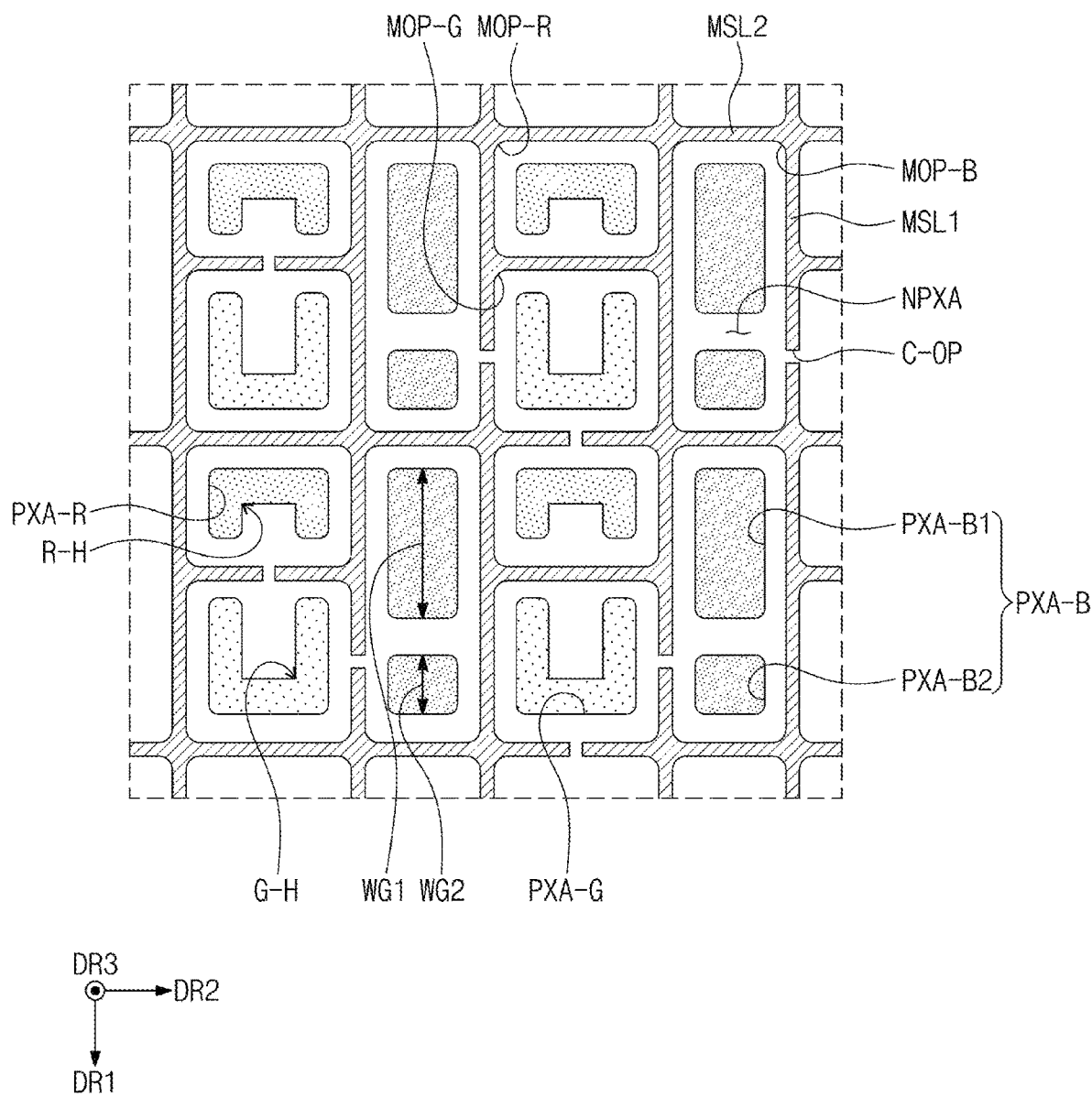
FIG. 8 is a plan view illustrating an arrangement relationship between emission areas and mesh lines according to an embodiment of the present inventive concepts.
Figure 9:
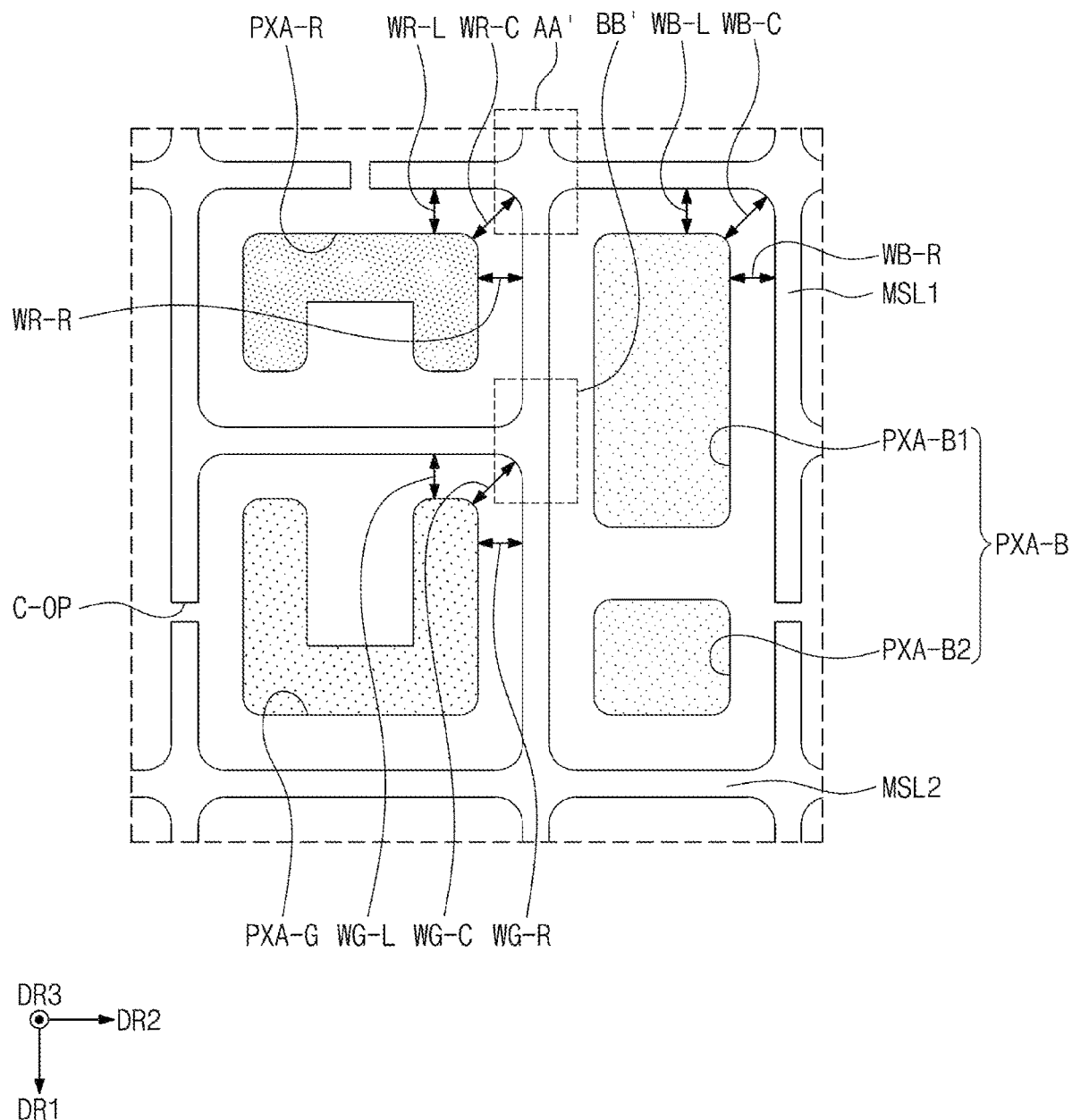
FIG. 9 is a plan view illustrating an arrangement relationship between emission areas and mesh lines according to an embodiment of the present inventive concepts.
Figure 10A:
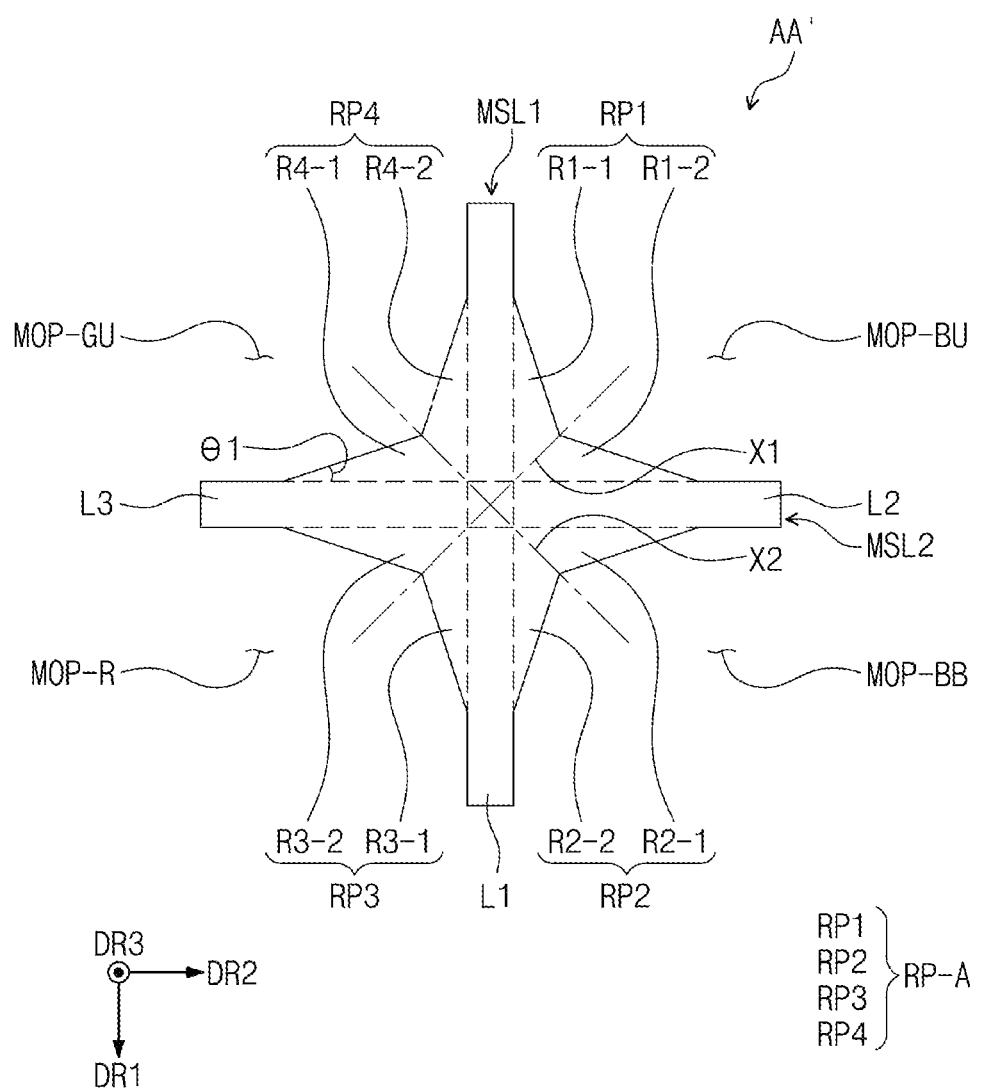
FIG. 10A is an enlarged plan view of an area AA' of FIG. 9 according to an embodiment of the present inventive concepts.
Figure 10B:
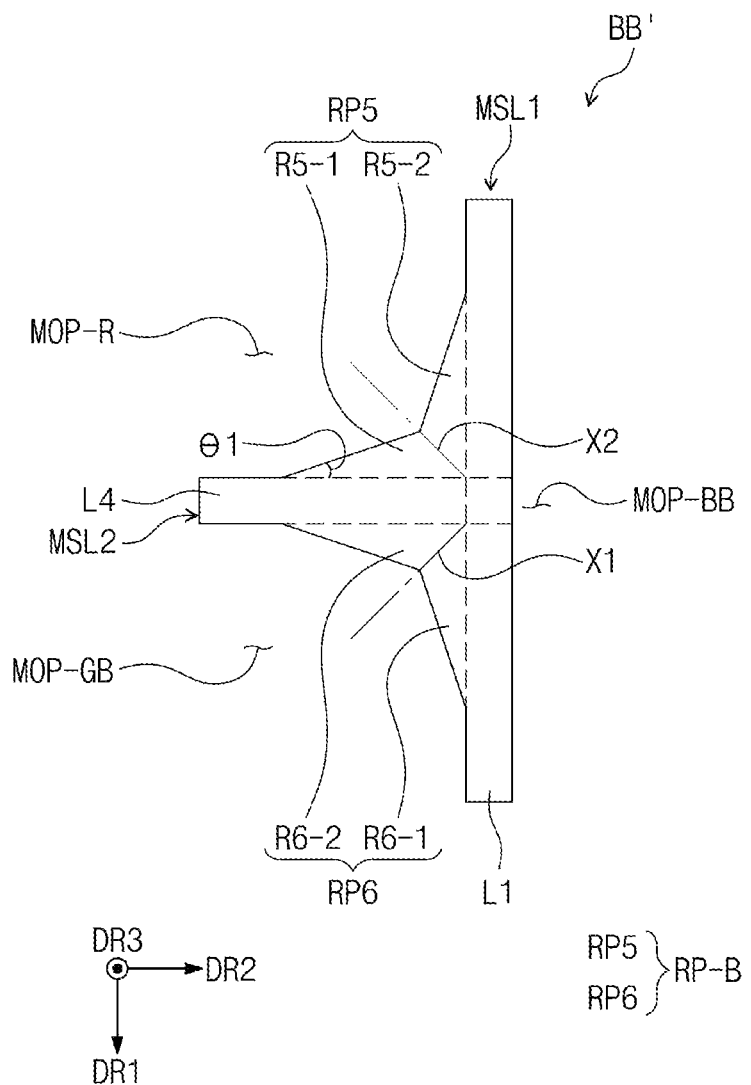
FIG. 10B is an enlarged plan view of an area BB' of FIG. 9 according to an embodiment of the present inventive concepts.
Figure 10C:
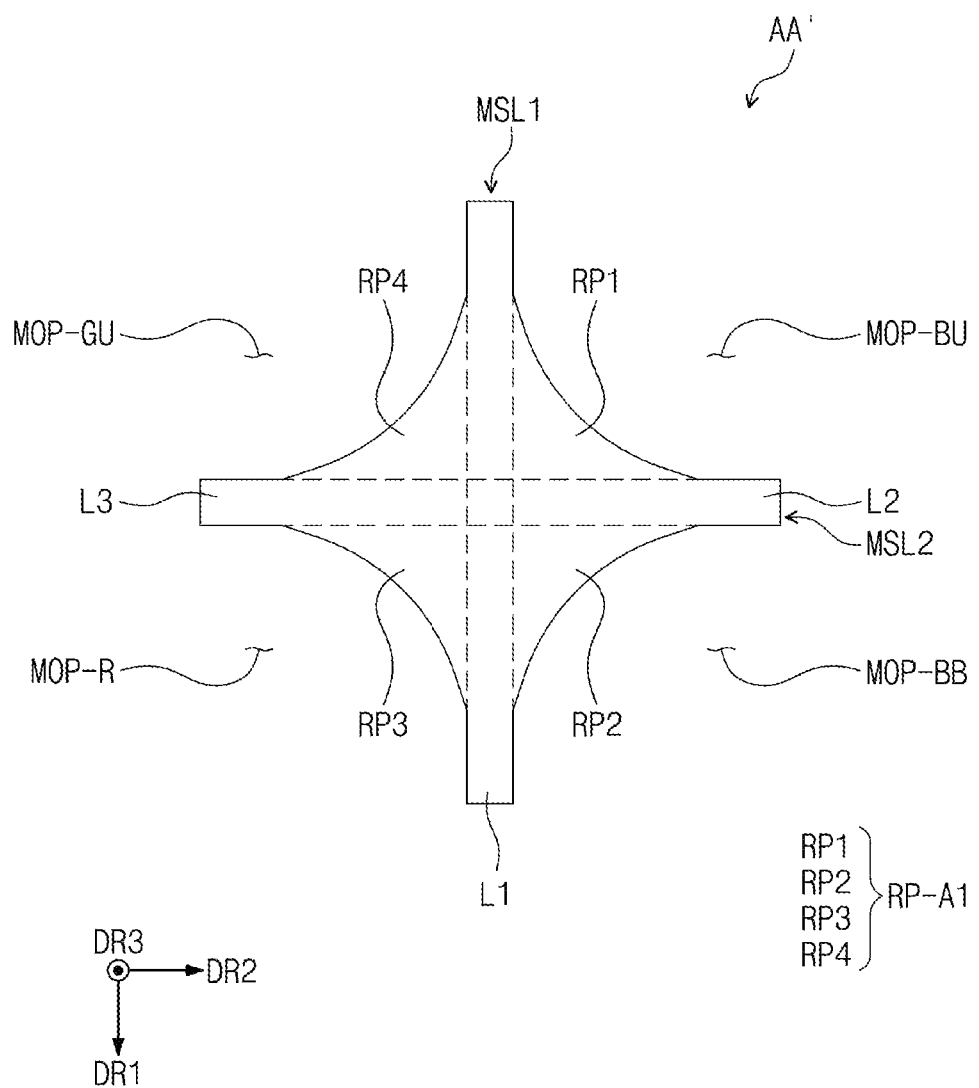
FIG. 10C is an enlarged plan view of the area AA' of FIG. 9 according to an embodiment of the present inventive concepts.
Figure 10D:
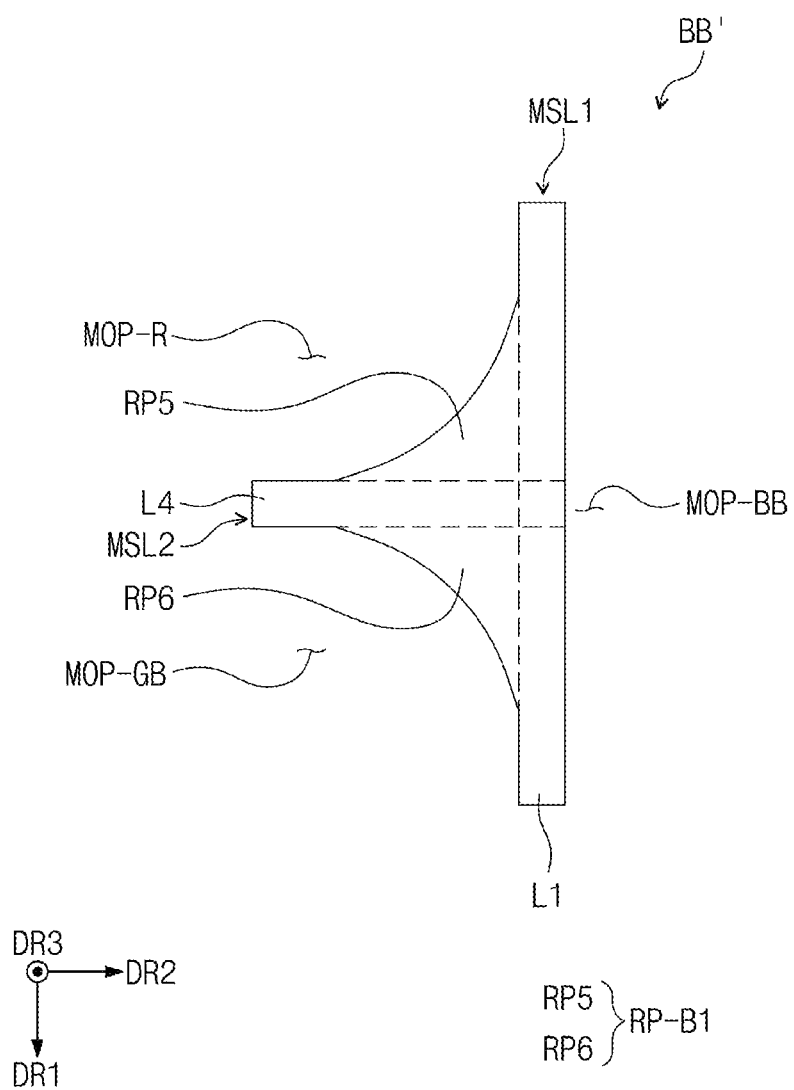
FIG. 10D is an enlarged plan view of the area BB' of FIG. 9 according to an embodiment of the present inventive concepts.

FIG. 8 is a plan view illustrating an arrangement relationship between emission areas and mesh lines according to an embodiment of the present inventive concepts. FIG. 9 is a plan view illustrating an arrangement relationship between emission areas and mesh lines according to an embodiment of the present inventive concepts. FIG. 10A is an enlarged plan view of an area AA' of FIG. 9 according to an embodiment of the present inventive concepts. FIG. 10B is an enlarged plan view of an area BB' of FIG. 9 according to an embodiment of the present inventive concepts. FIG. 10C is an enlarged plan view of the area AA' of FIG. 9 according to an embodiments of the present inventive concepts. FIG. 10D is an enlarged plan view of the area BB' of FIG. 9 according to an embodiment of the present inventive concepts. The same/similar reference numerals are used for the same/similar elements and/or configurations as the elements and/or configurations described in FIGS. 1 to 7, and redundant descriptions are omitted for convenience of explanation.

FIGS. 8 and 9 illustrate an arrangement relationship between a plurality of emission areas PXA-B, PXA-R, and PXA-G and mesh lines MSL in a plan view according to an embodiment of the present inventive concepts.

Hereinafter, an arrangement relationship between the emission areas PXA-B, PXA-R, and PXA-G and the mesh lines MSL to be described in this specification on the plane (e.g., in a plane defined in the first and second directions DR1, DR2) may be applied to the entire active area 1000A described in the embodiment of FIG. 5.

Also, in an embodiment, the mesh lines MSL to be described in this specification may be provided in the second conductive layer 204 described in the embodiment of FIG. 3B. Thus, the mesh lines MSL may be defined as being included in the first sensing patterns SP1, the first bridge pattern BP1, and the second sensing patterns SP2 described in the embodiments of FIGS. 6 and 7.

Referring to the embodiment of FIG. 8, the emission areas PXA-B, PXA-R, and PXA-G according to an embodiment of the present inventive concepts may provide different colored light and may have different areas, respectively. While the embodiment of FIG. 8 shows three emission areas comprising first to third emission areas PXA-B, PXA-R, and PXA-G, the number of the emission areas and the respective color of the light thereof may vary.

A shape of each of the emission areas PXA-B, PXA-R, and PXA-G on the plane (e.g., in a plane defined in the first and second directions DR1, DR2) described in this specification may correspond to a shape that is visually recognized when the opening 70-OP of the pixel defining layer 70 described in FIG. 3B is provided in plurality, and the emission areas PXA-B, PXA-R, and PXA-G are patterned in different shapes.

For example, in an embodiment, the first emission area PXA-B may be an area that provides blue light. As shown in the embodiment of FIG. 8, the first emission area PXA-B may include a first first emission area PXA-B1 and a second first emission area PXA-B2, which are spaced apart from each other in the first direction DR1. For example, the first first emission area PXA-B1 and the second first emission area PXA-B2 may be spaced apart from each other in the first direction DR1 with the peripheral area NPXA therebetween.

In this embodiment, the first first emission area PXA-B1 may have an area (e.g., in a plane defined in the first and second directions DR1, DR2) that is relatively greater than an area (e.g., in a plane defined in the first and second directions DR1, DR2) of the second first emission area PXA-B2. Thus, a first width WG1 of the first first emission area PXA-B1 in the first direction DR1 may be greater than a second width WG2 of the second first emission area PXA-B2 in the first direction DR1. In the second direction DR2, the widths of the first first emission area PXA-B1 and the second first emission area PXA-B2 may be substantially the same.

The blue light provided from the first first emission area PXA-B1 and the second first emission area PXA-B2 may be separately turned on/off by being connected to the separate transistor 100PC described with reference to the embodiment of FIG. 3B or may be simultaneously turned on/off by being connected to one transistor 100PC, but is not limited to any one embodiment.

In an embodiment, the second emission areas PXA-R may be an area that provides red light. The second emission area PXA-R may be disposed to be spaced apart from the first first emission area PXA-B1 in the second direction DR2 with the first mesh line MSL1, which overlaps the non-emission area NPXA, disposed therebetween.

In this embodiment, the second emission area PXA-R may have a 'C' shape of which a portion is recessed on the plane (e.g., in a plane defined in the first and second directions DR1, DR2). For example, a second emission groove R-H, of which a portion is recessed from a lower portion of the second emission area PXA-R in the first direction DR1, may be defined in the second emission area PXA-R.

In an embodiment, the third emission area PXA-G may be an area that provides green light. The third emission area PXA-G may be disposed to be spaced apart from the second first emission area PXA-B2 in the second direction DR2 with the first mesh line MSL1, which overlaps the non-emission area NPXA, therebetween.

In this embodiment, the third emission area PXA-G may have a 'ᴄ' shape of which a portion is recessed on the plane. For example, a third emission groove G-H, of which a portion is recessed from an upper portion of the third emission area PXA-G in the first direction DR1, may be defined in the third emission area PXA-G.

As shown in the embodiment of FIG. 8, the second emission groove R-H and the third emission groove G-H may face each other with the second mesh line MSL2 therebetween. However, embodiments of the present inventive concepts are not limited thereto. For example, in an embodiment, the second emission groove R-H and the third emission groove G-H may be defined in different directions, and each of the second emission groove R-H and the third emission groove G-H may be recessed toward the first emission area PXA-B. Additionally, in an embodiment, in the second and third emission areas PXA-R and PXA-G, respectively, at least one of the second and third emission grooves R-H and G-H may be omitted.

The mesh lines MSL according to an embodiment of the present inventive concepts may include a first mesh line MSL1 extending in the first direction DR1 and a second mesh line MSL2 extending in the second direction DR2. A cutting part C-OP of which one area is cut to prevent the patterned shapes of the mesh lines MSL from being visually recognized by the user may be disposed at an intermediate portion of each of the mesh lines MSL.

The first mesh line MSL1 and the second mesh line MSL2 may cross each other to define first to third inner areas MOP-B, MOP-R, and MOP-G that surround (e.g., in the first and second directions DR1, DR2) the first to third emission areas PXA-B, PXA-R, and PXA-G, respectively.

For example, the first inner area MOP-B may surround the first emission area PXA-B, the second inner area MOP-R may surround the second emission area PXA-R, and the third inner area MOP-G may surround the third emission area PXA-R.

Referring to the embodiments of FIGS. 9 to 10B, the mesh lines MSL according to an embodiment of the present inventive concept may be formed by repeating one pattern comprising a plurality of lines.

For example, a portion of the first mesh line MSL1 may be defined as a first line L1. The second mesh line MSL2 may include second to fourth lines L2, L3, and L4. A shape of the mesh lines MSL in the active area 1000A (see FIG. 3A) may be formed by arranging one pattern comprising the first to fourth lines L1, L2, L3, and L4 in in the first direction DR1 and the second direction DR2.

As shown in the embodiment of FIGS. 10A-10B, the first line L1 may extend in the first direction DR1. The second line L2 may extend in the second direction DR2 from a first side of the first line L1. The third line L3 may extend in the second direction DR2 from a second side that is opposite to the first side (e.g., in the second direction DR2) of the first line L1. The fourth line L4 may be spaced apart from the third line L3 in the first direction DR1 and may extend from the first line L1 in the second direction DR2. While the embodiment of FIGS. 10A-10B include four lines forming the mesh lines MSL, the number of the plurality of lines and the arrangement of the plurality of lines may vary.

The mesh lines MSL according to an embodiment of the present inventive concepts may include reinforcing patterns, such as first and second reinforcing patterns RP-A and RP-B. In the reinforcing patterns, such as the first and second reinforcing patterns RP-A and RP-B, each of the second to fourth lines L2, L3, and L4 may be disposed on the inner areas MOP-B, MOP-R, and MOP-G defined with the first line L1 and may protrude from portions of the lines L1, L2, L3 and L4 defining the corresponding inner area of the inner areas MOP-B, MOP-R, and MOP-G.

In an embodiment, the reinforcing patterns may include a first reinforcing pattern RP-A and a second reinforcing pattern RP-B.

As shown in the embodiment of FIG. 10A, the first reinforcing pattern RP-A may include first to fourth patterns RP1 to RP4. For example, the first pattern RP1 may be disposed on a first upper inner area MOP-BU defined by the first line L1 and the second line L2. The first pattern RP1 may protrude from the first line L1 and the second line L2 toward the first upper inner area MOP-BU.

The second pattern RP2 may be disposed on a first lower inner area MOP-BB defined by the first line L1 and the second line L2. The second pattern RP2 may protrude from the first line L1 and the second line L2 toward the first lower inner area MOP-BB.

Each of the first upper inner area MOP-BU and the first lower inner area MOP-BB may be defined as an area that provides blue light. For example, the first upper inner area MOP-BU and the first lower inner MOP-BB may surround adjacent first emission areas PXA-B respectively that are spaced apart from each other in the first direction DR1.

The third pattern RP3 may be disposed on a second inner area MOP-R defined by the first line L1 and the third line L3. The third pattern RP3 may protrude from the first line L1 and the third line L3 toward the second inner area MOP-R.

The fourth pattern RP4 may be disposed on a third upper inner area MOP-GU defined by the first line L1 and the third line L3. The fourth pattern RP4 may protrude from the first line L1 and the third line L3 toward the third upper inner area MOP-GU.

As shown in the embodiment of FIG. 10B, the second reinforcing pattern RP-B may include fifth and sixth patterns RP5 and RP6. For example, the fifth pattern RP5 may be disposed on the second inner area MOP-R defined by the first line L1 and the fourth line L4. The fifth pattern RP5 may protrude from the first line L1 and the fourth line L4 toward the second inner area MOP-R. The sixth pattern RP6 may protrude from the first line L1 and the fourth line L4 toward the third lower inner area MOP-GB.

Each of the third upper inner area MOP-GU and the third lower inner area MOP-GB may be defined as an area that provides green light. For example, the third upper inner area MOP-GU and the third lower inner area MOP-GB may surround adjacent third emission areas PXA-G respectively that are spaced apart from each other in the first direction DR1 and have a second emission area PXA-R disposed therebetween.

In this embodiment, a first angle $\theta 1$ defined between each of the reinforcing patterns RP-A and RP-B and lines defining the corresponding inner area may be in a range of about 15 degrees to about 35 degrees. In embodiments in which the first angle $\theta 1$ is less than about 15 degrees, disconnection may occur on a crossing area of the mesh lines MSL that are patterned in micrometer units. In embodiments in which the first angle $\theta 1$ exceeds about 35 degrees, an interference with the light provided from the emission area may occur to deteriorate light extraction efficiency.

As shown in the embodiment of FIG. 10A, the first pattern RP1 may include a first first portion R1-1 and a second first portion R1-2. The first first portion R1-1 and the second first portion R1-2 may be symmetrical with respect to a virtual first extension line X1 extending in a diagonal direction with respect to each of the first direction DR1 and the second direction DR2 and passing through a center of the first pattern RP1. For example, the diagonal direction may be between the first direction DR1 and the second direction DR2. The third pattern RP3 may also be applied in the same manner, and thus, a first third portion R3-1 and a second third portion R3-2 may be symmetrical with respect to the first extension line X1. As shown in the embodiment of FIG. 10B, the sixth pattern RP6 may also be applied in the same manner, and thus, a first sixth portion R6-1 and a second sixth portion R6-2 may be symmetrical with respect to the first extension line X1.

As shown in the embodiment of FIG. 10A, the second pattern RP2 may include a first second portion R2-1 and a second second portion R2-2. The first second portion R2-1 and the second second portion R2-2 may be symmetrical with respect to a virtual second extension line X2 extending in the diagonal direction with respect to each of the first direction DR1 and the second direction DR2 and passing through a center of the second pattern RP2. In an embodiment, the virtual second extension line X2 may be perpendicular to the virtual first extension line X1. The fourth pattern RP4 may be also applied in the same manner, and thus a first fourth portion R4-1 and a second fourth portion R4-2 may be symmetrical with respect to the second extension line X2. As shown in the embodiment of FIG. 10B, the fifth pattern RP5 may also be applied in the same manner, and thus, a first fifth portion R5-1 and a second fifth portion R5-2 may be symmetrical with respect to the second extension line X2.

According to an embodiment of the present inventive concepts, a width of each of the reinforcing patterns RP-A and RP-B may be gradually narrowed in the first direction DR1 and the second direction DR2 from an intersection of the lines defining the corresponding inner area.

Referring again to the embodiment of FIG. 9, a distance from one side of each of the first to third emission areas PXA-B, PXA-R, and PXA-G to each of the adjacent mesh lines MSL1 and MSL2 may be less than or equal to a distance from a corner of each of the emission areas PXA-B, PXA-R, PXA-G to each of the adjacent reinforcing patterns RP-A and RP-B.

For example, as shown in the embodiment of FIG. 9, a first first distance WB-R (e.g., in the second direction DR2) from a first side of the first first emission area PXA-B1 to the first mesh line MSL1 and a second first distance WB-L (e.g., in the first direction DR1) from a second side of the first first emission area PXA-B1 to the second mesh line MSL2 may be less than or equal to a distance WB-C (e.g., in a diagonal direction between the first and second directions DR1, DR2) from a corner of the first first emission area PXA-B1 to the first reinforcing pattern RP-A.

A first second distance WR-R (e.g., in the second direction DR2) from a first side of the second emission area PXA-R to the first mesh line MSL1 and a second second distance WR-L (e.g., in the first direction DR1) from a second side of the second emission area PXA-R to the second mesh line MSL2 may be less than or equal to a distance WR-C (e.g., in a diagonal direction between the first and second directions DR1, DR2) from a corner of the second emission area PXA-R to the first reinforcing pattern RP-A.

A first third distance WG-R (e.g., in the second direction DR2) from a first side of the third emission area PXA-G to the first mesh line MSL1 and a second third distance WG-L (e.g., in the first direction DR1) from a second side of the third emission area PXA-G to the second mesh line MSL2 may be less than or equal to a distance WG-C (e.g., in a diagonal direction between the first and second directions DR1, DR2) from a corner of the third emission area PXA-G to the second reinforcing pattern RP-B.

According to an embodiment of the present inventive concepts, since the mesh lines MSL include the reinforcing patterns, such as the first and second reinforcing patterns RP-A and RP-B, disposed adjacent to each other in a crossing area, a sensor layer 200 having increased stiffness may be provided. Also, as each of the reinforcing patterns, such as the first and second reinforcing patterns RP-A and RP-B, have a shape in which an interference with the emission areas PXA-B, PXA-R, and PXA-G is minimized, the display layer 100 having increased light extraction efficiency may be provided.

Referring to the embodiments of FIGS. 10C and 10D, the first and second mesh lines MSL1 and MSL2 according to an embodiment of the present inventive concepts may include a first reinforcing pattern RP-A1 and a second reinforcing pattern RP-B1. Descriptions of the first to fourth lines L1 to L4 provided in the mesh lines MSL1 and MSL2 and the inner areas may be applied in the same manner as in the embodiments of FIGS. 10A and 10B and a repeated description will be omitted for convenience of explanation.

As shown in the embodiment of FIGS. 10C and 10D, a portion of each of the first and second reinforcing patterns RP-A1 and RP-B1, which faces the corresponding inner area, among the reinforcing patterns RP-A1 and RP-B1 according to this embodiment may have a curvature (e.g., a predetermined curvature).

For example, each of a portion of the first pattern RP1, which faces the first upper inner area MOP-BU, a portion, which faces the first lower inner area MOP-BB, of the second pattern RP2, a portion, which faces the second inner area MOP-R, of the third pattern RP3, and a portion, which faces the third upper inner area MOP-GU, of the fourth pattern RP4 may have a predetermined curvature. For example, as shown in FIG. 10C, the outer edge of each of the first to fourth patterns RP1 to RP4 that is immediately adjacent to the first upper inner area MOP-BU, the first lower inner area MOP-BB, the second inner area MOP-R and the third upper inner area MOP-GU, respectively, may have the predetermined curvature.

Also, a portion, which faces the second inner area MOP-R, of the fifth pattern RP5 and a portion, which faces the third lower inner area MOP-GB, of the sixth pattern RP6 may have a predetermined curvature. For example, as shown in FIG. 10D, the outer edge of each of the fifth and sixth patterns RP5, RP6 that is immediately adjacent to the second inner area MOP-R and the third lower inner area MOP-GB, respectively, may have the predetermined curvature.

Figure 11:
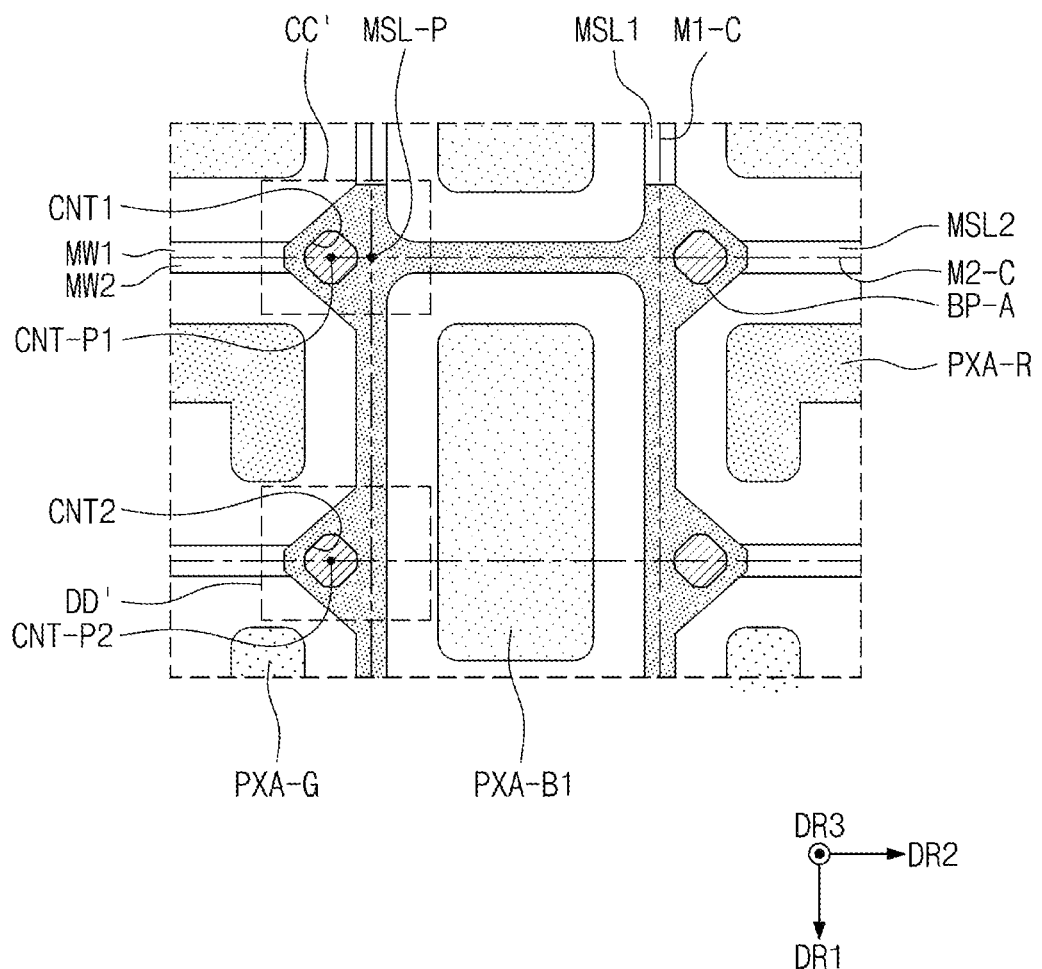
FIG. 11 is a plan view illustrating an arrangement relationship between emission areas and mesh lines according to an embodiment of the present inventive concepts.
Figure 12A:
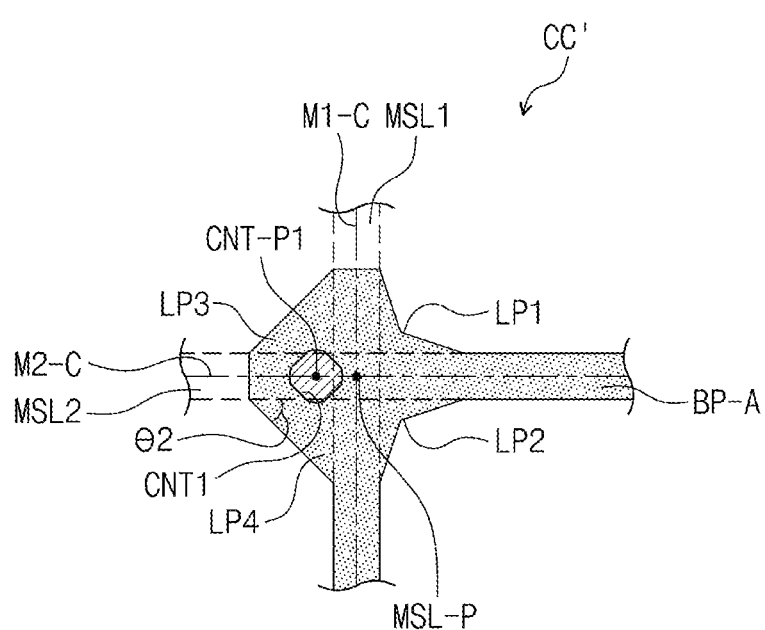
FIG. 12A is an enlarged plan view of an area CC' of FIG. 11 according to an embodiment of the present inventive concepts.
Figure 12B:
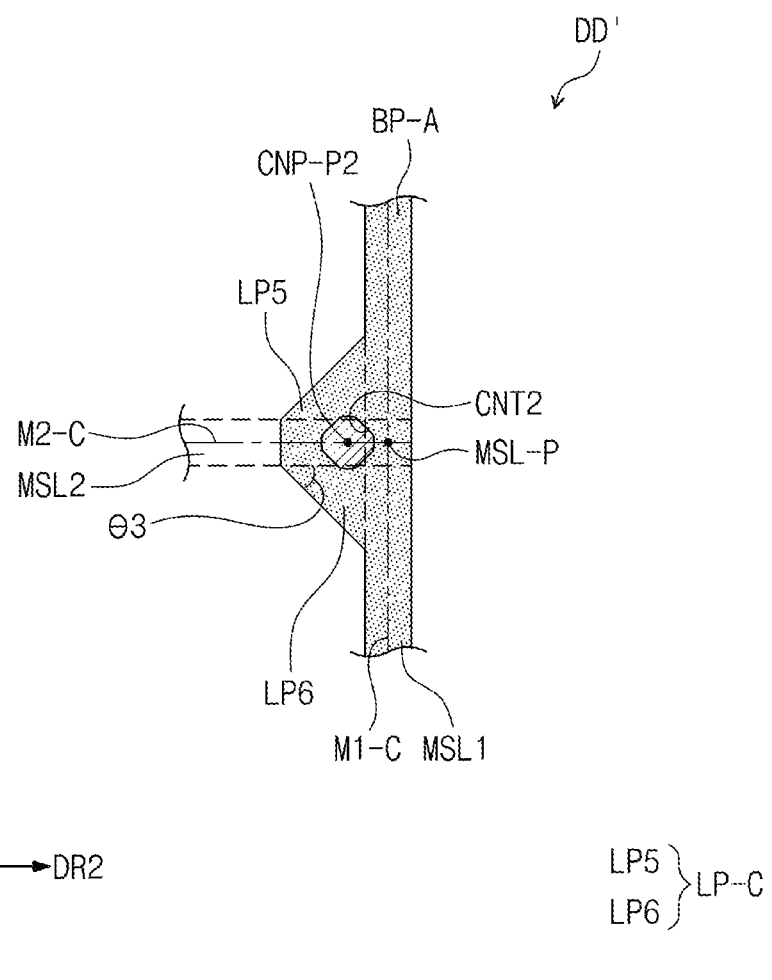
FIG. 12B is an enlarged plan view of an area DD' of FIG. 1I according to an embodiment of the present inventive concepts.

FIG. 11 is a plan view illustrating an arrangement relationship between emission areas and mesh lines according to an embodiment of the present inventive concepts. FIG. 12A is an enlarged plan view of an area CC' of FIG. 11 according to an embodiment of the present inventive concepts. FIG. 12B is an enlarged plan view of an area DD' of FIG. 1/ according to an embodiment of the present inventive concepts.

FIG. 11 illustrates an arrangement relationship between the plurality of emission areas, such as the first to third emission areas PXA-B, PXA-R, and PXA-G, the mesh lines MSL provided in the second conductive layer 204 (see FIG. 3B), and the second bridge pattern BP-A provided in the first conductive layer 202 (see FIG. 3B) on the plane (e.g., in a plane defined in the first and second directions DR1, DR2). The bridge pattern BP-A may be applied to the second bridge pattern BP2 described in FIGS. 5 to 7.

Referring to FIG. 11, the bridge pattern BP-A according to an embodiment of the present inventive concepts may be connected to the first and second mesh lines MSL1 and MSL2 through the first and second contact holes CNT1 and CNT2. An embodiment related to the contact holes to be described in an embodiment of the present inventive concepts may correspond to the contact hole CNT of the second sensing insulating layer 203 described in FIG. 3B.

The bridge pattern BP-A may extend to overlap the mesh lines MSL1 and MSL2 (e.g., in the third direction DR3). Referring to the embodiments of FIGS. 12A and 12B, the bridge pattern BP-A may include additional reinforcing patterns, such as first to third additional reinforcing patterns, LP-A, LP-B, and LP-C of which at least a portion overlap the reinforcing patterns RP-A and RP-B described in the embodiments of FIGS. 10A and 10B.

In an embodiment, the first additional reinforcing pattern LP-A may include a first additional pattern LP1 and a second additional pattern LP2. In an embodiment, the first additional pattern LP1 and the second additional pattern LP2 may have the same shape as the first pattern RP1 and the second pattern RP2 described in the embodiment of FIG. 10A, respectively. However, embodiments of the present inventive concepts are not limited thereto. For example, in an embodiment, the outer edge of the first additional pattern LP1 and the second additional pattern LP2 may have a predetermined curvature.

The second additional reinforcing pattern LP-B may include a third additional pattern LP3 and a fourth additional pattern LP4. As shown in the embodiment of FIG. 12A, the second angle θ2 defined by the outer edge of each of the third additional pattern LP3 and the fourth additional pattern LP4 and each of the first mesh line MSL1 and the second mesh line MSL2 on the plane may be about 45 degrees.

As shown in the embodiment of FIG. 12B, the third additional reinforcing pattern LP-C may include a fifth additional pattern LP5 and a sixth additional pattern LP6. A third angle θ3 defined by an outer edge of each of the fifth additional pattern LP5 and the sixth additional pattern LP5 and each of the first mesh line MSL1 and the second mesh line MSL2 may be about 45 degrees.

In this embodiment, the first additional reinforcing pattern LP-A may protrude toward the first emission area PXA-B, which provides the blue light, among the first to third emission areas PXA-B, PXA-R, and PXA-G described in the embodiment of FIG. 8. The second additional reinforcing pattern LP-B and the third additional reinforcing pattern LP-C may protrude toward the second and third emission areas PXA-R and PXA-G, which provide the red light and the green light, among the first to third emission areas PXA-B, PXA-R, and PXA-G.

As illustrated in the embodiments of FIGS. 11 to 12B, a virtual first center line M1-C extending in the first direction DR1 and passing through a center of the first mesh line MSL1 (e.g., in the second direction DR2) may be defined. Also, a virtual second center line M2-C extending in the second direction DR2 and passing through a center of the second mesh line MSL2 (e.g., in the first direction DR1) may be defined. Widths of the first portion MW1 and the second portion MW2 in the first direction DR1 based on the second center line M2-C may be the same.

An intersection of the first center line M1-C and the second center line M2-C may be defined as a mesh center point MSL-P.

A contact hole center point CNT-P1, CNT-P2 of the first and second contact holes CNT1 and CNT2, respectively, according to this embodiment may be shifted toward the additional reinforcing patterns LP-B and LP-C, each of which has a relatively large area, among the additional reinforcing patterns. Thus, the contact hole center point CNT-P1, CNT-P2 of the first and second contact holes CNT1 and CNT2 may be spaced apart from the mesh center point MSL-P along the second center line M2-C in the second direction DR2, based on the corresponding first mesh line MSL1.

In an embodiment, each of the contact holes CNT1 and CNT2 may have a rhombus shape with respect to the plane defined in the first direction DR1 and the second direction DR2.

Figure 13:
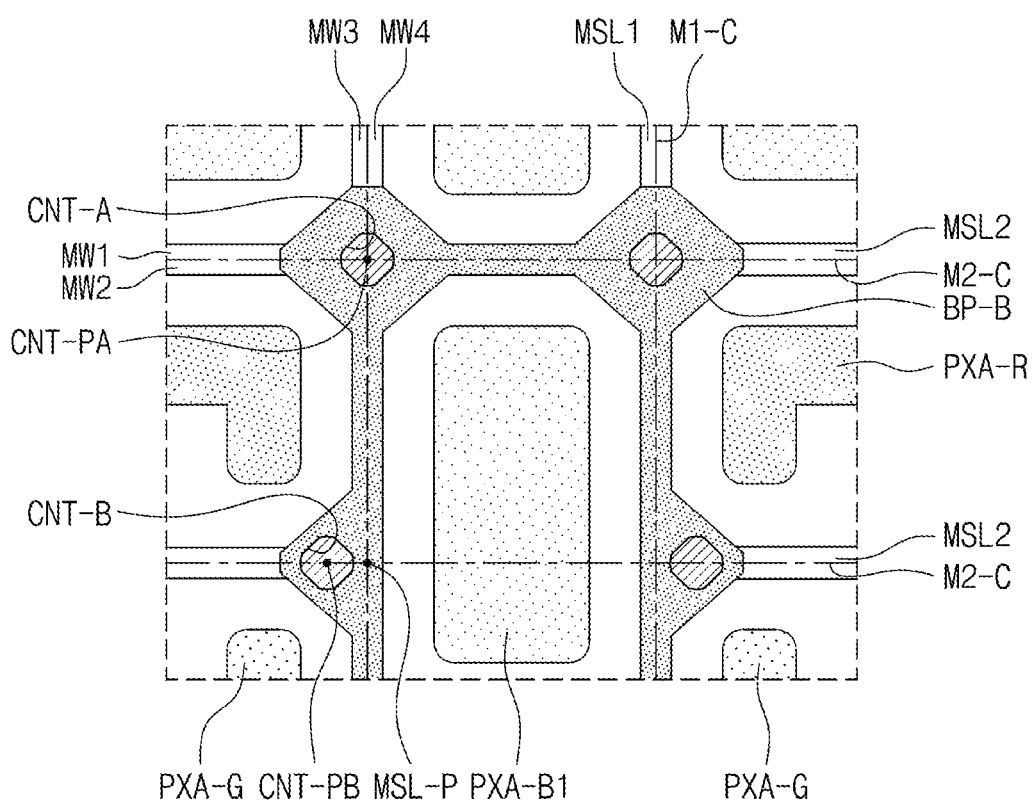
FIG. 13 is a plan view illustrating an arrangement relationship between emission areas and mesh lines according to an embodiment of the present inventive concepts.
Figure 14:
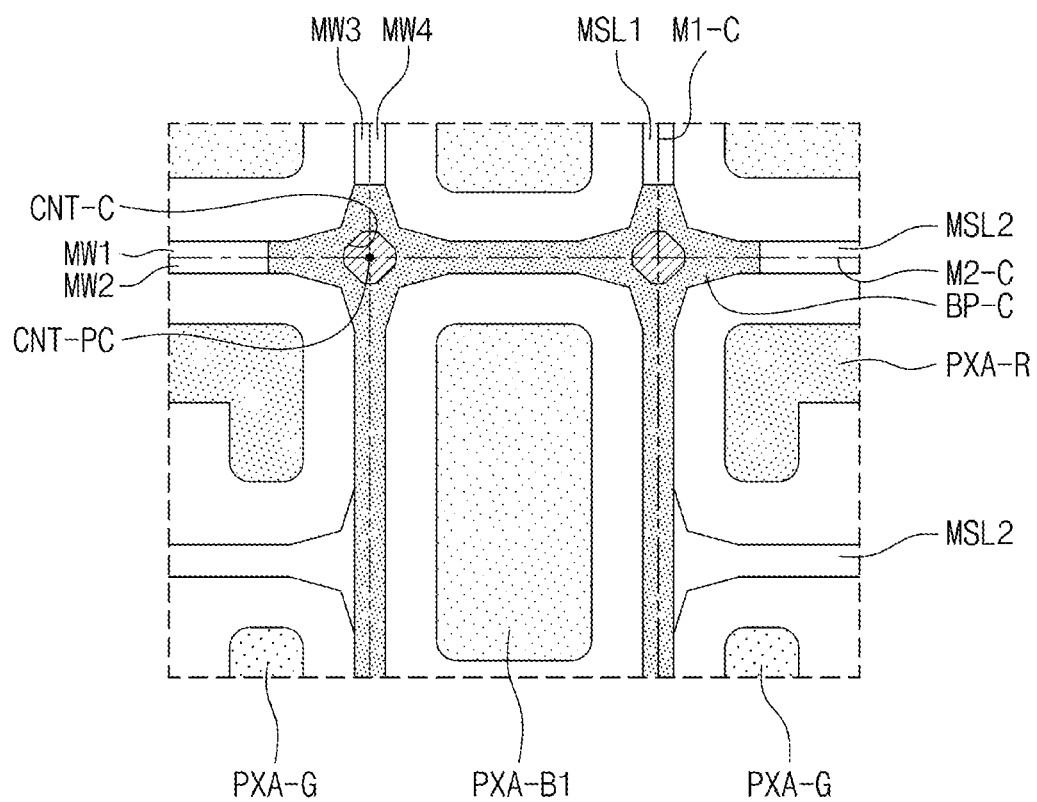
FIG. 14 is a plan view illustrating an arrangement relationship between emission areas and mesh lines according to an embodiment of the present inventive concepts.
Figure 14:
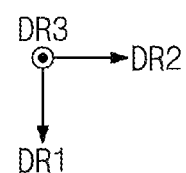

According to an embodiment, as the first and second contact holes CNT1 and CNT2 overlap the additional reinforcing patterns LP-B and LP-C, each of which has a relatively large area, among the additional reinforcing patterns, mis-alignment may be reduced. Thus, contact failure between the sensing patterns and the bridge pattern may be prevented FIG. 13 is a plan view illustrating an arrangement relationship between emission areas and mesh lines according to an embodiment of the present inventive concepts. FIG. 14 is a plan view illustrating an arrangement relationship between emission areas and mesh lines according to an embodiment of the present inventive concepts. The same/similar reference numerals are used for the same/similar elements and configurations as in FIGS. 11 to 12B, and redundant descriptions are omitted for convenience of explanation.

Referring to FIG. 13, the bridge pattern BP-B may extend to overlap the first and second mesh lines MSL1 and MSL2. The bridge pattern BP-B according to this embodiment may include an additional reinforcing pattern corresponding to the second additional reinforcing pattern LP-B and the third additional reinforcing pattern LP-C described in FIGS. 12A and 12B. Thus, an angle defined by the additional reinforcing pattern provided in the bridge pattern BP-B and each of the first and second mesh lines MSL1 and MSL2 on the plane (e.g., in a plane defined in the first and second directions DR1, DR2) may be about 45 degrees.

In this embodiment, the center points of each of the contact holes CNT-A and CNT-B may be defined differently within the bridge pattern BP-B.

For example, the contact hole center point CNT-PA of the first contact hole CNT-A may overlap the mesh center point MSL-P (see FIG. 11) at which the first center line M1-C and the second center line M2-C cross each other. Widths of the first portion MW3 and the second portion MW4 of the first mesh line MSL1, which are divided by the first center line M1-C, in the second direction DR2 may be the same.

In the area of the bridge pattern BP-B in which the first contact hole CNT-A is defined, since the additional reinforcing pattern, which is angled at about 45 degrees with respect to each of the mesh lines MSL1 and MSL2, is disposed on four areas, even if the first contact hole CNT-A is defined in the mesh center point MSL-P, the contact failure may not occur.

The positioning of the contact hole center point CNT-PB of the second contact hole CNT-B may be shifted toward the side at which the additional reinforcing pattern of the bridge pattern BP-B is disposed. Thus, the contact hole center point CNT-PB may be spaced apart from the mesh center point MSL-P along the second center line M2-C in the second direction DR2, based on the corresponding first mesh line MSL1.

Referring to the embodiment of FIG. 14, the bridge pattern BP-C may extend to overlap the mesh lines MSL1 and MSL2. The bridge pattern BP-C according to this embodiment may include an additional reinforcing pattern corresponding to the first additional reinforcing pattern LP-A described in FIG. 12A. Thus, an angle defined by the additional reinforcing pattern provided in the bridge pattern BP-B and each of the first and second mesh lines MSL1 and MSL2 on the plane (e.g., in a plane defined in the first and second directions DR1, DR2) may be in a range of about 15 degrees to about 35 degrees.

As shown in the embodiment of FIG. 14, the contact hole center point CNT-PC of each of the contact holes CNT-C may overlap the mesh center point MSL-P (see FIG. 11). In this embodiment, in the case of a section, in which only three intersections are defined, of the mesh lines MSL as illustrated in FIG. 10B, the contact hole may be omitted.

According to an embodiment of the present inventive concepts, since the mesh lines provided in the conductive layer include the reinforcing patterns disposed adjacent to each other on the crossing areas, the sensor layer that is reinforced in rigidity may be provided. In addition, as the reinforcing pattern has the shape in which the interference with the emission areas is minimized, the display layer having increased light extraction efficiency may be provided.

It will be apparent to those skilled in the art that various modifications and deviations can be made in the present inventive concepts. Thus, it is intended that the present disclosure covers the modifications and deviations of the present inventive concepts.

Accordingly, the technical scope of the present inventive concepts should not be limited to the contents described in the detailed description of the specification, but should be determined by the claims.

What is claimed is:

1. An electronic device comprising:
   a display layer comprising a plurality of emission areas that provide different colored light, respectively, and a non-emission area that is adjacent to the plurality of emission areas; and
   a sensor layer comprising a first sensing insulating layer disposed on the display layer, a first conductive layer disposed on the first sensing insulating layer, a second sensing insulating layer disposed on the first sensing insulating layer to cover the first conductive layer, and a second conductive layer disposed on the second sensing insulating layer and comprising mesh lines extending in first and second directions, that cross each other, each of the mesh lines are disposed on a same layer as each other;
   wherein the mesh lines comprise:
   a first line extending in the first direction;
   a second line extending in the second direction from a first side of the first line;
   a third line extending in the second direction from a second side of the first line that is opposite to the first side of the first line;
   a fourth line spaced apart from the third line in the first direction and extending in the second direction from the second side of the first line; and
   a reinforcing pattern disposed on inner areas defined by the first line and each of the second line, the third line, and the fourth line, respectively, the reinforcing pattern protruding from portions of the first to fourth lines that define each inner area of the inner areas; and
   wherein the fourth line faces a first inner area defined by the first and second lines in the second direction with the first line interposed therebetween.

2. The electronic device of claim 1, wherein an angle defined by the portions of the first to fourth lines that define each of the inner areas, and the reinforcing pattern is in a range of about 15 degrees to about 35 degrees.

3. The electronic device of claim 1, wherein the reinforcing pattern is symmetric with respect to a virtual extension line that passes through a center of the reinforcing pattern and extends in a diagonal direction between the first direction and the second direction.

4. The electronic device of claim 1, wherein, in the reinforcing pattern, an outer edge of the reinforcing pattern that faces the inner areas has a predetermined curvature.

5. The electronic device of claim 1, wherein the reinforcing pattern has a width that is gradually narrowed from an intersection of the lines defining the inner area in the first direction and the second direction.

6. The electronic device of claim 1, wherein the sensor layer comprises:
   a plurality of first sensing electrodes arranged in the first direction, each of the plurality of first sensing electrodes comprises a plurality of first sensing patterns arranged in the second direction and a first bridge pattern disposed between adjacent first sensing patterns of the plurality of first sensing patterns; and
   a plurality of second sensing electrodes that are insulated from the first sensing electrodes and are arranged in the second direction, each of the plurality of second sensing electrodes comprises a plurality of second sensing patterns arranged in the first direction and a second bridge pattern disposed between adjacent second sensing patterns of the plurality of the second sensing patterns,
   wherein the second conductive layer comprises the plurality of first sensing patterns, the first bridge pattern, and the plurality of second sensing patterns,
   the first conductive layer comprises the second bridge pattern,
   contact holes overlapping the second bridge pattern are defined in the second sensing insulating layer, and
   the second sensing patterns are connected to the second bridge pattern through the contact holes.

7. The electronic device of claim 6, wherein the second bridge pattern comprises at least one additional reinforcing pattern, at least a portion of each of the at least one additional reinforcing pattern overlaps the reinforcing pattern.

8. The electronic device of claim 7, wherein:
   a center of each of the contact holes overlaps the third line and the fourth line, the center of each of the contact holes are spaced apart from a virtual first center line in the second direction to correspond to each other, the virtual first center line extends in the first direction and passes through a center of the first line.

9. The electronic device of claim 8, wherein the at least one additional reinforcing pattern comprises:
   a first additional pattern that is angled at an angle of about 45 degrees with respect to portions of the first to fourth lines that define a first portion of the inner areas; and
   a second additional pattern that is angled at an angle in a range of about 15 degrees to about 35 degrees with respect to portions of the first to fourth lines that define a second portion of the inner areas.

10. The electronic device of claim 9, wherein the second additional pattern is symmetrical with respect to a virtual extension line passing through a center of the second additional pattern and extending in a diagonal direction between the first direction and the second direction.

11. The electronic device of claim 9, wherein in the second additional pattern, an outer edge of the second additional pattern that faces the inner area has a predetermined curvature.

12. The electronic device of claim 7, wherein the contact holes include:
   a first contact hole adjacent to the third line and having a center disposed on a virtual first center line that extends in the first direction and passes through a center of the first line; and
   a second contact hole adjacent to the fourth line and having a center spaced apart from the virtual first center line.

13. The electronic device of claim 12, wherein the additional reinforcing pattern is angled at an angle of about 45 degrees with respect to the portions of the first to fourth lines that define each inner area of the inner areas.

14. The electronic device of claim 7, wherein the additional reinforcing pattern has a same shape as the reinforcing pattern.

15. The electronic device of claim 14, wherein centers of the contact holes overlap each other on a virtual first center line extending in the first direction and passing through a center of the first line.

16. The electronic device of claim 6, wherein each of the contact holes has a rhombus shape with respect to a plane defined in the first direction and the second direction.

17. The electronic device of claim 1, wherein the display layer comprises:
a circuit layer comprising a transistor;
a light emitting element layer comprising a first electrode connected to the transistor, a pixel defining layer that exposes a portion of the first electrode and defines a corresponding emission area of the plurality of emission areas, an emission layer disposed on the first electrode, and a second electrode disposed on the emission layer; and
an encapsulation layer configured to cover the light emitting element layer and alternately stacked with a plurality of inorganic and organic layers,
wherein the sensor layer is directly disposed on the encapsulation layer.

18. An electronic device comprising:
a display layer comprising a plurality of emission areas that provide different colored light, respectively, and a non-emission area that is adjacent to the plurality of emission areas; and
a sensor layer comprising a first sensing insulating layer disposed on the display layer, a first conductive layer disposed on the first sensing insulating layer, a second sensing insulating layer disposed on the first sensing insulating layer to cover the first conductive layer, and a second conductive layer disposed on the second sensing insulating layer and comprising mesh lines extending in first and second directions, that cross each other,
wherein the mesh lines comprise:
a first line extending in the first direction;
a second line extending in the second direction from a first side of the first line;
a third line extending in the second direction from a second side of the first line that is opposite to the first side of the first line;
a fourth line spaced apart from the third line in the first direction and extending in the second direction from the second side of the first line; and
a reinforcing pattern disposed on inner areas defined by the first line and each of the second line, the third line, and the fourth line, respectively, the reinforcing pattern protruding from portions of the first to fourth lines that define each inner area of the inner areas, wherein the plurality of emission areas comprise:
a first emission area disposed at a left side with respect to the first line to provide a first color;
a second emission area disposed at a right side with respect to the first line and an upper side with respect to the fourth line to provide a second color; and
a third emission area disposed at a right side with respect to the first line and a lower side with respect to the fourth line to provide a third color,
wherein the first emission area comprises a first first emission area and a second first emission area, that are spaced apart from each other with the non-emission area therebetween in the first direction, the first first emission area and the second first emission area have areas different from each other.

19. The electronic device of claim 18, wherein a distance from one side of each of the first to third emission areas to an adjacent portion of each of the mesh lines on a plane is less than or equal to a distance from a corner of each of the first to third emission areas to an adjacent portion of the reinforcing pattern.

20. The electronic device of claim 18, wherein an emission groove having a portion that is recessed in a plane is defined in at least one of the second emission area or the third emission area.

* * * * *